(12) United States Patent
Tanimoto et al.

(10) Patent No.: US 11,088,313 B2
(45) Date of Patent: Aug. 10, 2021

(54) LAYERED BODY

(71) Applicant: Mitsui Chemicals, Inc., Tokyo (JP)

(72) Inventors: Kazuhiro Tanimoto, Ichihara (JP); Hiroyuki Sekino, Yokohama (JP); Masaki Amano, Yokohama (JP)

(73) Assignee: MITSUI CHEMICALS, INC., Tokyo (JP)

( * ) Notice: Subject to any disclaimer, the term of this patent is extended or adjusted under 35 U.S.C. 154(b) by 570 days.

(21) Appl. No.: 16/082,462

(22) PCT Filed: Mar. 8, 2017

(86) PCT No.: PCT/JP2017/009344
§ 371 (c)(1),
(2) Date: Sep. 5, 2018

(87) PCT Pub. No.: WO2017/155006
PCT Pub. Date: Sep. 14, 2017

(65) Prior Publication Data
US 2019/0088850 A1    Mar. 21, 2019

(30) Foreign Application Priority Data
Mar. 9, 2016 (JP) .............................. JP2016-046183

(51) Int. Cl.
*H01L 41/053* (2006.01)
*H01L 41/193* (2006.01)
(Continued)

(52) U.S. Cl.
CPC .............. *H01L 41/053* (2013.01); *B32B 7/02* (2013.01); *B32B 7/06* (2013.01); *C08L 67/04* (2013.01);
(Continued)

(58) Field of Classification Search
CPC ... H01L 41/053; H01L 41/45; H01L 41/0471; H01L 41/93; H01L 41/277
See application file for complete search history.

(56) References Cited

U.S. PATENT DOCUMENTS

| 5,403,701 A | 4/1995 | Lum et al. |
| 9,136,461 B2 * | 9/2015 | Tanimoto .................. C08J 5/18 |

(Continued)

FOREIGN PATENT DOCUMENTS

| JP | 05152638 A | 6/1993 |
| JP | 05299720 A | 11/1993 |

(Continued)

OTHER PUBLICATIONS

Office Action issued by the Chinese Patent Office in corresponding Chinese Patent Application No. 201780014912.6 dated Sep. 3, 2019 (16 pages including partial English translation).

(Continued)

*Primary Examiner* — Bryan P Gordon
(74) *Attorney, Agent, or Firm* — Buchanan, Ingersoll & Rooney PC

(57) ABSTRACT

A layered body includes: a polymer film (A), the polymer film (A) including an organic piezoelectric material having a weight average molecular weight of from 50,000 to 1,000,000, having a standardized molecular orientation MORc at a reference thickness of 50 μm of from 1.0 to 15.0 as measured by a microwave transmission molecular orientation analyzer, having a degree of crystallinity of from 20% to 80% as measured by a DSC method, and having an internal haze of 50% or less with respect to visible light; and a peelable protective film (B) that contacts one main face of the polymer film (A). The maximum indentation depth h (Continued)

max on a face of the protective film (B) that contacts the polymer film (A) is from 53 nm to 100 nm as measured by a nanoindentation method.

15 Claims, 1 Drawing Sheet

(51) Int. Cl.
| | | |
|---|---|---|
| *H01L 41/45* | (2013.01) | |
| *B32B 7/06* | (2019.01) | |
| *B32B 7/02* | (2019.01) | |
| *C08L 67/04* | (2006.01) | |
| *C09J 7/38* | (2018.01) | |
| *C09J 7/40* | (2018.01) | |
| *H01L 41/047* | (2006.01) | |
| *B32B 27/08* | (2006.01) | |
| *B32B 27/30* | (2006.01) | |
| *B32B 27/32* | (2006.01) | |

(52) U.S. Cl.
CPC ............... *C09J 7/385* (2018.01); *C09J 7/405* (2018.01); *H01L 41/0471* (2013.01); *H01L 41/193* (2013.01); *H01L 41/45* (2013.01); *B32B 27/08* (2013.01); *B32B 27/308* (2013.01); *B32B 27/32* (2013.01); *B32B 2266/025* (2013.01); *B32B 2307/204* (2013.01); *B32B 2307/414* (2013.01); *B32B 2307/748* (2013.01); *B32B 2367/00* (2013.01); *B32B 2405/00* (2013.01)

(56) References Cited

U.S. PATENT DOCUMENTS

| | | | | |
|---|---|---|---|---|
| 2012/0247217 | A1* | 10/2012 | Suzuki | ..................... G01L 1/02 |
| | | | | 73/717 |
| 2014/0084204 | A1 | 3/2014 | Tanimoto et al. | |
| 2016/0099403 | A1 | 4/2016 | Tanimoto et al. | |
| 2016/0204337 | A1* | 7/2016 | Tanimoto | ............ H01L 41/0533 |
| | | | | 428/355 AC |
| 2016/0238466 | A1* | 8/2016 | Tanimoto | ............ H01L 41/1132 |
| 2016/0284977 | A1 | 9/2016 | Tanimoto et al. | |

FOREIGN PATENT DOCUMENTS

| | | |
|---|---|---|
| JP | 2005213376 A | 8/2005 |
| JP | 2013199649 A | 10/2013 |
| JP | 2014027038 A | 2/2014 |
| JP | 2015188055 A | 10/2015 |
| TW | 201509672 A | 3/2015 |
| WO | 2014168188 A1 | 10/2014 |
| WO | 2015030174 A1 | 3/2015 |
| WO | 2015079899 A1 | 6/2015 |
| WO | 2015170446 A1 | 11/2015 |
| WO | 2015/194661 A1 | 12/2015 |

OTHER PUBLICATIONS

International Search Report (PCT/ISA/210) dated Jun. 6, 2017, by the Japanese Patent Office as the International Searching Authority for International Application No. PCT/JP2017/009344.
Examination Report dated May 11, 2020, by the Taiwanese Patent Office in Corresponding Taiwanese Patent Application No. 106107519 and partial English translation of the Report. (10 pages).

* cited by examiner

ID BODY

TECHNICAL FIELD

The present invention relates to a layered body.

BACKGROUND ART

Organic materials having a piezoelectric property are known. Examples thereof include polymer materials in which a helical chiral polymer (for example, polylactic acid-based polymer) having optical activity is used.

For example, a polymeric piezoelectric material that exhibits a piezoelectric coefficient of about 10 pC/N at ordinary temperature and that is obtained by stretching a molded product of polylactic acid is disclosed (for example, see Japanese Patent Application Laid-Open (JP-A) No. H05-152638).

It has also been reported that a special orientation method that is referred to as a forging method is used in order to impart high orientation to a polylactic acid crystal, thereby achieving a high piezoelectric property of about 18 pC/N is achieved by (for example, see JP-A No. 2005-213376).

SUMMARY OF INVENTION

Technical Problem

In the case of using polymer films for manufacturing various devices, the appearance of the devices (products) may be impaired due to generation of scratches on the polymer films and attachment of foreign matters.

There are cases where a protective film is provided on a polymer film in order to protect the polymer film. The provision of the protective film makes it possible to store or transport the polymer film in the state of a roll in which the polymer film is wound in a roll shape until the polymer film is used for manufacturing a device, and also reduces, for example, generation of scratches on the polymer film at the time of handling.

In practical use of the polymer film for manufacturing various devices, there are cases where the protective film is peeled away just before processing. In such an occasion, an excessively high adhesive strength between the protective film and the polymer film may cause a part of the protective film to remain on a surface of the polymer film.

Further, as a result of studies, the present inventors have found that, even when the protective film can be peeled from the polymer film without leaving a residual protective film on the surface of the polymer film containing an organic piezoelectric material, the surface of the polymer film after peeling may have an orange peel texture. It is conceivable that the reason therefor is that organic piezoelectric materials are generally highly deformable, and that, due to high charging tendency of organic piezoelectric materials, minute foreign matters are adsorbed between the protective film and the polymer film when attaching the protective film, thereby causing deformation of the surface of the polymer film due to the presence of the foreign matters. In such a case, the quality of the polymer film itself may be deteriorated, and, furthermore, the appearance and quality of a device manufactured using the polymer film may also be deteriorated.

In consideration of the above circumstances, an object of the present invention is to provide a layered body that includes a polymer film containing an organic piezoelectric material and a protective film and that alleviates deterioration in appearance of the polymer film after the protective film is peeled off.

Solution to Problem

Specific means for achieving the object are as described below.

<1> A layered body including:

a polymer film (A), the polymer film (A) including an organic piezoelectric material having a weight average molecular weight of from 50,000 to 1,000,000, having a standardized molecular orientation MORc at a reference thickness of 50 μm of from 1.0 to 15.0 as measured by a microwave transmission molecular orientation analyzer, having a degree of crystallinity of from 20% to 80% as measured by a DSC method, and having an internal haze of 50% or less with respect to visible light; and a peelable protective film (B) that contacts one main face of the polymer film (A), wherein the maximum indentation depth h max on a face of the protective film (B) that contacts the polymer film (A) is from 53 nm to 100 nm as measured by a nanoindentation method.

<2> The layered body according to <1>, wherein the maximum indentation depth h max is from 53 nm to 60 nm.

<3> The layered body according to <1> or <2>, wherein the protective film (B) includes a base material layer and a pressure-sensitive adhesive layer that is disposed on a main face of the base material layer which faces the polymer film (A), and the maximum indentation depth h max is a maximum indentation depth obtained by measurement on the pressure-sensitive adhesive layer side of the protective film (B).

<4> The layered body according to <3>, wherein the pressure-sensitive adhesive layer has an acid value of 10 mg KOH/g or less.

<5> The layered body according to <3> or <4>, wherein the base material layer is formed of a polyolefin-based resin or a polyethylene terephthalate-based resin, and the pressure-sensitive adhesive layer includes a pressure-sensitive acrylic adhesive.

<6> The layered body according to any one of <1> to <5>, wherein the T-peel strength between the polymer film (A) and the protective film (B) is from 0.07 N/50 mm to 1 N/50 mm.

<7> The layered body according to any one of <1> to <6>, wherein the polymer film (A) has an internal haze of 40% or less with respect to visible light, and a piezoelectric coefficient $d_{14}$ of 1 pC/N or more as measured by a stress-charge method at 25° C.

<8> The layered body according to <7>, wherein the internal haze is 1% or less.

<9> The layered body according to any one of <1> to <8>, wherein the polymer film (A) has a standardized molecular orientation MORc of from 3.5 to 15.0, and a product of the standardized molecular orientation MORc of the polymer film (A) and the degree of crystallinity of the polymer film (A) is from 70 to 700.

<10> The layered body according to any one of <1> to <9>, wherein the organic piezoelectric material is a helical chiral polymer (X) having optical activity.

<11> The layered body according to <10>, wherein the helical chiral polymer (X) is a polylactic acid-based polymer having a main chain containing a repeating unit represented by the following Formula (1):

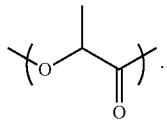

(1)

<12> The layered body according to <10> or <11>, wherein the helical chiral polymer (X) has an optical purity of 95.00% e.e. or higher.

<13> The layered body according to any one of <10> to <12>, wherein the content of the helical chiral polymer (X) in the polymer film (A) is 80% by mass or more.

<14> The layered body according to any one of <10> to <13>, wherein the polymer film (A) includes one or more stabilizers (Y) in an amount of from 0.01 parts by mass to 10 parts by mass with respect to 100 parts by mass of the helical chiral polymer (X), the one or more stabilizers (Y) being selected from the group consisting of stabilizers (Y1) having a weight average molecular weight of from 200 to 60000 and having one or more kinds of functional groups selected from the group consisting of a carbodiimide group, an epoxy group, and an isocyanate group, and stabilizers (Y2) having an iminoether group.

<15> The layered body according to any one of <1> to <14>, wherein the elastic modulus of the protective film (B) and the elastic modulus of the polymer film (A) satisfy the following Relational Expression (F):

Elastic Modulus of Protective Film (B)/Elastic
Modulus of Polymer Film (A)≥0.1.   Relational Expression (F)

Advantageous Effects of Invention

According to the present invention, a layered body that includes a polymer film containing a helical chiral polymer and a protective film and that alleviates deterioration in appearance of the polymer film after the protective film is peeled off is provided.

DESCRIPTION OF EMBODIMENTS

Figure 1:
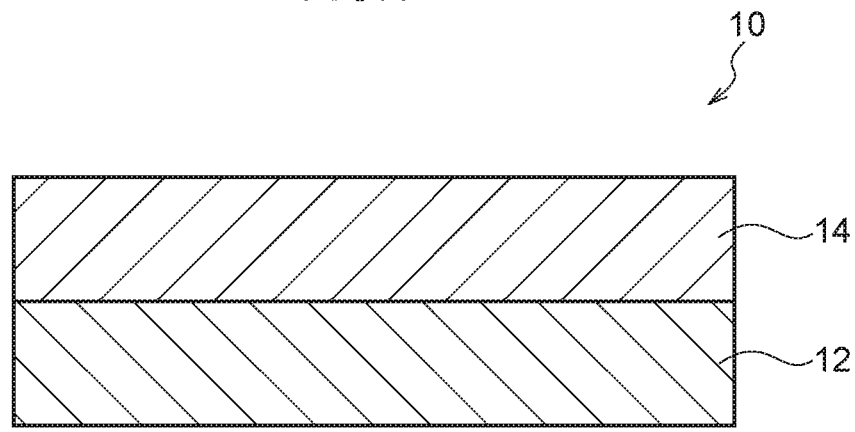
FIG. 1 is a cross-sectional view illustrating a first embodiment of a layered body according to the present disclosure.

Hereinafter, embodiments of the present invention will be described. In the present specification, any numerical range expressed using "to" means a range including numerical values described before and after "to" as a lower limit value and an upper limit value.
In the present specification, the scope of the term "polymer film" includes a polymer sheet. In the present specification, a main face of a film means a face that faces in the thickness direction of the film (in other words, a face that includes the length direction and the width direction). The "main face" may also be referred to as simply a "face". In the present specification, a "face" of a member means a "main face" of the member unless otherwise specified.
Here, the "MD direction" is a direction in which a film is conveyed (machine direction), that is, the stretching direction, and the "TD direction" is a direction (transverse direction) that is orthogonal to the MD direction and that is parallel to a main face of the film.

<<Layered Body>>

A layered body according to the present disclosure includes:
a polymer film (A), the polymer film (A) including an optically active organic piezoelectric material having a weight average molecular weight of from 50,000 to 1,000,000, having a standardized molecular orientation MORc at a reference thickness of 50 μm of from 1.0 to 15.0 as measured by a microwave transmission molecular orientation analyzer, having a degree of crystallinity of from 20% to 80% as measured by a DSC method, and having an internal haze of 50% or less with respect to visible light; and
a peelable protective film (B) that contacts one main face of the polymer film (A),
wherein the maximum indentation depth h max on a face of the protective film (B) that contacts the polymer film (A) is from 53 nm to 100 nm as measured by a nanoindentation method.

Note that the layered body according to the present disclosure may further include another peelable protective film in contact with the other main face of the polymer film (A).

Studies by the present inventors have revealed that, when a peelable protective film is peeled from a layered body that includes the protective film and a polymer film containing an organic piezoelectric material, there is a tendency that a part of the protective film remains on a surface of the polymer film, and, even when the protective film does not remain on the surface of the polymer film, the surface of the polymer film tends to turn into an orange peel texture.

Here, the "orange peel texture" means occurrence of wrinkles or unevenness (differences in level) on a surface similar to an orange peel. The width of each recess of the orange peel texture is about several millimeters, and the depth thereof is about several micrometers to several tens of micrometers.

In consideration of the above, the present inventors have adopted a layered body having a layer structure in which the polymer film (A) containing the organic piezoelectric material and having the above characteristics and the protective film (B) used in combination, and have further adjusted the maximum indentation depth h max on a face of the protective film (B) that contacts the polymer film (A) to be within the above range as measured by a nanoindentation method. The inventors have found that this configuration can alleviates the deterioration in appearance of the polymer film (A) after the protective film (B) is peeled therefrom, and have completed the present invention.

In the present disclosure, due to the maximum indentation depth h max being 53 nm or more, remaining of a part of the protective film (B) on a surface of the polymer film (A) and turning of the surface of the polymer film (A) into an orange peel texture after the protective film (B) is peeled off are reduced.

In addition, due to the maximum indentation depth h max being 100 nm or less, the protective film (B) can easily be peeled from the layered body; that is, the peelability of the protective film (B) is favorable.

Therefore, by setting the maximum indentation depth h max to be within the above range, deterioration in appearance of the polymer film (A) after the protective film (B) is peeled therefrom is alleviated.

Hereinafter, preferable embodiments of the present disclosure will be described.

In the present disclosure, the organic piezoelectric material may be a helical chiral polymer (hereinafter also referred to as a "helical chiral polymer (X)") or an organic piezoelectric material other than the helical chiral polymer.

In the layered body according to the present disclosure, the maximum indentation depth h max is preferably from 53 nm to 60 nm. As described above, a maximum indentation depth h max of 53 nm or more reduces formation of an orange peel texture on a surface of the polymer film (A) after the protective film (B) is peeled therefrom. In addition, a maximum indentation depth h max of 60 nm or less reduces remaining of a part of the protective film (B) on a surface of the polymer film (A), and further improves peelability of the protective film (B).

Therefore, by setting the maximum indentation depth h max to be within the above range, deterioration in appearance of the polymer film (A) after the protective film (B) is peeled therefrom is further alleviated.

In the layered body according to the present disclosure, the protective film (B) includes a base material layer and a pressure-sensitive adhesive layer that is disposed on a main face of the base material layer which faces the polymer film (A), and the maximum indentation depth h max is preferably a maximum indentation depth obtained by measurement on the pressure-sensitive adhesive layer side of the protective film (B).

In this configuration, since the protective film (B) is affixed to the polymer film (A) via the pressure-sensitive adhesive layer, the adhesive strength between both films is enhanced.

Furthermore, due to the maximum indentation depth h max of the protective film (B) being 53 nm or more, that is, due to the maximum indentation depth h max of the pressure-sensitive adhesive layer being 53 nm or more, remaining of a part of the pressure-sensitive adhesive layer on a surface of the polymer film (A) and turning of the surface of the polymer film (A) into an orange peel texture after peeling the protective film (B) away are reduced.

In addition, due to the maximum indentation depth h max being 100 nm or less, the protective film (B) can easily be peeled from the layered body; that is, the peelability of the protective film (B) is favorable.

In the layered body according to the present disclosure, the pressure-sensitive adhesive layer preferably has an acid value of 10 mg KOH/g or less. An acid value of the pressure-sensitive adhesive layer of 10 mg KOH/g or less suppresses a decrease in the molecular weight of the organic piezoelectric material, such as the helical chiral polymer (X), contained in the polymer film (A), and thereby improves the stability of the polymer film (A).

In the layered body according to the present disclosure, it is preferable that the base material layer is formed of a polyolefin-based resin or a polyethylene terephthalate-based resin, and that the pressure-sensitive adhesive layer includes a pressure-sensitive acrylic adhesive. This configuration increases the adhesive force between the base material layer and the pressure-sensitive adhesive layer, and makes it easier to peel the protective film (B) from the layered body.

In the layered body according to the present disclosure, the T-peel strength between the polymer film (A) and the protective film (B) is preferably from 0.07 N/50 mm to 1 N/50 mm. A T-peel strength of 0.07 N/50 mm or more ensures an adhesive strength between the polymer film (A) and the protective film (B). A T-peel strength of 1 N/50 mm or less ensures peelability of the protective film (B).

In the layered body according to the present disclosure, the polymer film (A) preferably has an internal haze of 40% or less with respect to visible light and a piezoelectric coefficient $d_{14}$ of 1 pC/N or more as measured by a stress-charge method at 25° C.

The polymer film (A) is a piezoelectric film having transparency, which makes it possible to apply the polymer film (A) to various piezoelectric devices.

In the layered body according to the present disclosure, the internal haze is preferably 1% or less from the viewpoint of improving transparency of the polymer film (A).

In the layered body according to the present disclosure, it is preferable that the standardized molecular orientation MORc of the polymer film (A) is from 3.5 to 15.0, and that the product of the standardized molecular orientation MORc of the polymer film (A) and the degree of crystallinity of the polymer film (A) is from 70 to 700.

The polymer film (A) is a piezoelectric film. When the standardized molecular orientation MORc is within the above range and the above product is within the above range, the piezoelectric property of the polymer film (A) improves.

In the layered body according to the present disclosure, the helical chiral polymer (X) is preferably a polylactic acid-based polymer having a main chain including a repeating unit represented by the following Formula (1), from the viewpoint of further improving the piezoelectric property when using the polymer film (A) as a piezoelectric film.

In the layered body according to the present disclosure, the helical chiral polymer (X) preferably has an optical purity of 95.00% e.e. or higher from the viewpoint of further improving the piezoelectric property when using the polymer film (A) as a piezoelectric film.

In the layered body according to the present disclosure, the content of the organic piezoelectric material in the polymer film (A) is preferably 80% by mass or more. For example, when the organic piezoelectric material is a helical chiral polymer (X), the content of the helical chiral polymer (X) in the polymer film (A) is preferably 80% by mass or more.

In the layered body according to the present disclosure, the polymer film (A) preferably includes one or more stabilizers (Y) in an amount of from 0.01 parts by mass to 10 parts by mass with respect to 100 parts by mass of the organic piezoelectric material, the one or more stabilizers (Y) being selected from the group consisting of stabilizers (Y1) having a weight average molecular weight of from 200 to 60,000 and having one or more kinds of functional groups selected from the group consisting of a carbodiimide group, an epoxy group, and an isocyanate group, and stabilizers (Y2) having an iminoether group, from the viewpoint of improving moisture and heat resistance of the polymer film (A). For example, when the organic piezoelectric material is a helical chiral polymer (X), the polymer film (A) preferably includes one or more kinds of stabilizers (Y) in an amount of from 0.01 parts by mass to 10 parts by mass with respect to 100 parts by mass of the helical chiral polymer (X), wherein the one or more kinds of stabilizers (Y) being selected from the group consisting of stabilizers (Y1) having a weight average molecular weight of from 200 to 60,000 and having one or more kinds of functional groups selected from the group consisting of a carbodiimide group, an epoxy group, and an isocyanate group, and stabilizers (Y2) having an iminoether group.

Hereinafter, the layered body according to the present disclosure will be described in more detail.

<Polymer Film (A)>

[Organic Piezoelectric Material]

The organic piezoelectric material includes an organic piezoelectric material having a weight average molecular weight of from 50,000 to 1,000,000.

An organic piezoelectric material may be adopted as the organic piezoelectric material according to the present disclosure regardless of whether the organic piezoelectric material is a low molecular material or a high molecular material. Examples of the organic piezoelectric material according to the present disclosure include polyvinylidene fluoride, polyvinylidene fluoride-based copolymers, polyvinylidene cyanide, vinylidene cyanide-based copolymers, odd nylons such as nylon 9 and nylon 11, aromatic nylons, alicyclic nylons, polyurea, helical chiral polymers such as polylactic acid, polyhydroxy carboxylates such as polyhydroxybutyrate, cellulose-based derivatives, and polypeptides.

The organic piezoelectric material is preferably a polymeric organic piezoelectric material, and particularly preferably an optically active helical chiral polymer (X) from the viewpoints of, for example, favorable piezoelectric characteristics, processability, and availability.

—Helical Chiral Polymer (X)—

When the polymer film (A) according to the present disclosure includes a helical chiral polymer, the helical chiral polymer is an optically active helical chiral polymer having a weight average molecular weight of from 50,000 to 1,000,000 (also referred to as a "helical chiral polymer (X)" in the present application).

Here, the "optically active helical chiral polymer" refers to a polymer having a molecular structure that is a helical structure, and having molecular optical activity.

The helical chiral polymer (X) according to the present disclosure is a polymer that is an "optically active helical chiral polymer" described above, and that has a weight average molecular weight of from 50,000 to 1,000,000.

Examples of the helical chiral polymer (X) include polylactic acid-based polymers and poly(β-hydroxybutyric acid).

The helical chiral polymer (X) has an optical purity of preferably 95.00% e.e. or higher, more preferably 96.00% e.e. or higher, still more preferably 99.00% e.e. or higher, and further more preferably 99.99% e.e. or higher. The helical chiral polymer (X) desirably has an optical purity of 100.00% e.e.

An optical purity of the helical chiral polymer (X) within the above range provides an increased degree of crystallinity and enhanced packing property of polymer crystals in the polymer film (A), as a result of which, for example, a piezoelectric property (piezoelectric coefficient) can be further improved in the case of using the polymer film (A) as a piezoelectric film.

Here, the optical purity of the helical chiral polymer (X) is a value calculated according to the following formula:

Optical purity (% e.e.)=100×|amount of L isomer– amount of D isomer|/(amount of L isomer+ amount of D isomer)

That is, the optical purity of the helical chiral polymer (X) is a value obtained by multiplying {a numerical value obtained by dividing [a difference (absolute value) between the amount (% by mass) of an L-isomer of the helical chiral polymer (X) and the amount (% by mass) of a D-isomer of the helical chiral polymer (X)] by [the total amount of the amount (% by mass) of the L-isomer of the helical chiral polymer (X) and the amount (% by mass) of the D-isomer of the helical chiral polymer (X)]} by 100.

The amount (% by mass) of the L-form of the helical chiral polymer (X) and the amount (% by mass) of the D-form of the helical chiral polymer (X) are values obtained by a method using high performance liquid chromatography (HPLC). The measurement method is as follows.

1.0 g of a sample (polymer film (A)) is weighed out and added into a 50 mL Erlenmeyer flask, and 2.5 mL of isopropyl alcohol (IPA) and 5 mL of a 5.0 mol/L sodium hydroxide solution are added thereto. Subsequently, the Erlenmeyer flask containing the sample solution is put in a water bath at a temperature of 40° C., and stirred for about five hours until the helical chiral polymer (X) completely hydrolyzes.

The sample solution is cooled to room temperature, 20 mL of a 1.0 mol/L hydrochloric acid solution is thereafter added for neutralization, and the Erlenmeyer flask is sealed tightly, followed by agitating well. 1.0 mL of the sample solution is put in a 25 mL volumetric flask, and the liquid volume is adjusted to 25 mL using the mobile phase, to prepare an HPLC sample solution 1. 5 μL of the HPLC sample solution 1 is injected into an HPLC device. The peak areas of the D-isomer and L-isomer of the helical chiral polymer (X) are determined under the following HPLC conditions, and the amount of the L-form and the amount of the D-form are calculated therefrom.

—HPLC Measurement Conditions—

Column: an optical resolution column, which is SUMICHIRAL OA 5000 manufactured by Sumika Chemical Analysis Center Co., Ltd.

Measuring device: Liquid chromatograph manufactured by JASCO Corporation

Column temperature: 25° C.

Mobile phase: 1.0 mM copper(II) sulfate buffer/IPA=98/2 (V/V) copper(II) sulfate/IPA/water=156.4 mg/20 mL/980 mL Mobile phase flow rate: 1.0 ml/min Detector: Ultraviolet detector (UV 254 nm)

The helical chiral polymer (X) is preferably a compound having a main chain including a repeating unit represented by the following Formula (1) from the viewpoint of further improving the piezoelectric property in the case of using the polymer film (A) as a piezoelectric film.

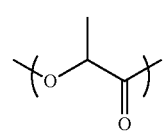

(1)

Among compounds that include a repeating unit represented by Formula (1) in the main chain, polylactic acid-based polymers are preferable.

Here, a "polylactic acid-based polymer" refers to a polylactic acid (a polymer formed only from repeating units derived from a monomer or monomers selected from L-lactic acid or D-lactic acid), a copolymer of L-lactic acid or D-lactic acid and a compound copolymerizable with the L-lactic acid or D-lactic acid, or a mixture thereof.

Among polylactic acid-based polymers, polylactic acid is preferable, and a L-lactic acid homopolymer (PLLA) or a D-lactic acid homopolymer (PDLA) is most preferable.

Polylactic acid is a polymer formed from a long chain of lactic acid polymerized via ester bonds.

It is known that polylactic acid can be produced by, for example, a lactide method in which polylactic acid is formed from lactide, or a direct polymerization method in which polymerization is performed by heating lactic acid under reduced pressure in a solvent while removing water.

Examples of polylactic acid include L-lactic acid homopolymers, D-lactic acid homopolymers, block copolymers containing a polymer of at least one of L-lactic acid or D-lactic acid, and graft copolymers containing a polymer of at least one of L-lactic acid or D-lactic acid.

Examples of the "compound copolymerizable with L-lactic acid or D-lactic acid" include: hydroxycarboxylic acids such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; cyclic esters such as glycolide, β-methyl-δ-valerolactone, γ-valerolactone, and ε-caprolactone; polyvalent carboxylic acids such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohols such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexane dimethanol; polysaccharides such as cellulose; and aminocarboxylic acids such as α-amino acids.

Examples of the "copolymer of L-lactic acid or D-lactic acid and a compound copolymerizable with the L-lactic acid or D-lactic acid" include block copolymers or graft copolymers having a polylactic acid sequence capable of generating a helical crystal.

The concentration of structures derived from copolymer components in the helical chiral polymer (X) is preferably 20% by mol or less.

For example, when the helical chiral polymer (X) is a polylactic acid-based polymer, the concentration of structures derived from copolymer components is preferably 20% by mol or less with respect to the sum of the molar number of a structure derived from lactic acid and the molar number of structures derived from compounds copolymerizable with lactic acid (copolymer components) in the polylactic acid-based polymer.

The polylactic acid-based polymer can be produced, for example, by a method in which lactic acid is directly dehydration-condensed and which is described in, for example, JP-A Nos. S59-096123 and H07-033861, or a method in which ring-opening polymerization is performed using lactide—a cyclic dimer of lactic acid—, and which is described in, for example, U.S. Pat. Nos. 2,668,182 and 4,057,357.

The polylactic acid-based polymer obtained by any of the above production methods is preferably made to have an optical purity of 95.00% e.e. or higher; for example, in the case of production of polylactic acid using the lactide method, it is preferable to polymerize lactide having an optical purity that has been heightened to 95.00% e.e. or higher by a crystallization operation.

—Weight Average Molecular Weight—

The organic piezoelectric material has a weight average molecular weight (Mw) of from 50,000 to 1,000,000 as described above.

Due to the Mw of the organic piezoelectric material being 50,000 or more, the mechanical strength of the polymer film (A) improves. The Mw is preferably 100,000 or more, and more preferably 200,000 or more.

Due to the Mw of the organic piezoelectric material being 1,000,000 or less, the moldability at the time of obtaining the polymer film (A) by molding (for example, extrusion molding) improves. The Mw is preferably 800,000 or less, and more preferably 300,000 or less.

The organic piezoelectric material has a molecular weight distribution (Mw/Mn) of preferably from 1.1 to 5, and more preferably of from 1.2 to 4, from the viewpoint of the strength of the polymer film (A). The molecular weight distribution (Mw/Mn) is still more preferably from 1.4 to 3.

The weight average molecular weight Mw and the molecular weight distribution (Mw/Mn) of the organic piezoelectric material refer to values obtained by measurement using gel permeation chromatography (GPC). Here, Mn is the number average molecular weight of the organic piezoelectric material.

An example of a method for measuring Mw and Mw/Mn of the organic piezoelectric material using GPC is described below.

—GPC Measuring Device—

GPC-100 manufactured by Waters Corporation

—Column—

SHODEX LF-804 manufactured by Showa Denko K.K.

—Preparation of Sample—

The polymer film (A) is dissolved in a solvent (for example, chloroform) at 40° C. to prepare a sample solution having a concentration of 1 mg/ml.

—Measurement Condition—

0.1 ml of the sample solution is loaded on a column using a solvent [chloroform] at a flow rate of 1 ml/min and a temperature of 40° C.

The sample concentration in the sample solution that has been subjected to separation using the column is measured with a differential refractometer.

A universal calibration line is made using polystyrene standard samples, and the weight average molecular weight (Mw) and the molecular weight distribution (Mw/Mn) of the organic piezoelectric material are calculated.

The polylactic acid-based polymer as an example of the organic piezoelectric material is a helical chiral polymer, and commercially available polylactic acids may be used.

Examples of commercially available products include PURASORB (PD and PL) manufactured by PURAC Corporation, LACEA (H-100 and H-400) manufactured by Mitsui Chemicals Inc., and an Ingeo™ biopolymer manufactured by Nature Works LLC.

In order obtain a polylactic acid-based polymer having a weight average molecular weight (Mw) of 50,000 or more to be used as the organic piezoelectric material, the polylactic acid-based polymer is preferably produced using the lactide method or the direct polymerization method.

The polymer film (A) according to the present disclosure may include one of the organic piezoelectric material described above, or two or more of the organic piezoelectric material described above.

The content of the organic piezoelectric material (total content if two or more organic piezoelectric materials are contained) in the polymer film (A) is preferably 80% by mass or more with respect to the total amount of the polymer film (A). For example, when the organic piezoelectric material is a helical chiral polymer (X), the content of the helical chiral polymer (X) (total content if two or more helical chiral polymers (X) are contained) in the polymer film (A) is preferably 80% by mass or more with respect to the total amount of the polymer film (A).

[Stabilizer (Y)]

The polymer film (A) preferably further includes one or more stabilizers (Y) selected from the group consisting of stabilizers (Y1) having a weight average molecular weight of from 200 to 60,000 and having one or more kinds of functional groups selected from the group consisting of a carbodiimide group, an epoxy group, and an isocyanate group in one molecule, and stabilizers (Y2) having an iminoether group. The inclusion of such stabilizers improves the moisture and heat resistance of the polymer film (A).

When the polymer film (A) includes the stabilizer (Y)—that is, when the polymer film (A) includes one or more stabilizers (Y) selected from the group consisting of the stabilizers (Y1) and the stabilizers (Y2), the content of stabilizer (Y) is preferably from 0.01 parts by mass to 10 parts by mass, more preferably from 0.01 parts by mass to 5 parts by mass, still more preferably from 0.1 parts by mass to 3 parts by mass, and particularly preferably from 0.5 parts by mass to 2 parts by mass, with respect to 100 parts by mass of the organic piezoelectric material. For example, when the organic piezoelectric material is a helical chiral polymer (X), the content of stabilizer (Y) is preferably from 0.01 parts by mass to 10 parts by mass, more preferably from 0.01 parts by mass to 5 parts by mass, still more preferably from 0.1 parts by mass to 3 parts by mass, and particularly preferably from 0.5 part by mass to 2 parts by mass, with respect to 100 parts by mass of the helical chiral polymer (X)

A content of stabilizer (Y) of 0.01 parts by mass or more further improves the moisture and heat resistance of the polymer film (A). A content of stabilizer (Y) of 10 parts by mass or less further suppresses a decrease in transparency.

When two or more stabilizers (Y) are used in combination, each of the contents indicated above refer to the total amount of the two or more stabilizers (Y).

(Stabilizer (Y1))

Examples of stabilizer (Y1) that can be used include the stabilizer (B) described in paragraphs [0039] to [0055] of International Publication pamphlet WO2013/054918.

Examples of compounds (carbodiimide compounds) containing a carbodiimide group in one molecule that can be used as the stabilizer (Y1) include a monocarbodiimide compound, a polycarbodiimide compound, and a cyclic carbodiimide compound.

Examples of suitable monocarbodiimide compounds include dicyclohexyl carbodiimide and bis-2,6-diisopropylphenyl carbodiimide.

Polycarbodiimide compounds produced by various methods may be used as the polycarbodiimide compound. Polycarbodiimide compounds produced by conventional polycarbodiimide production methods (for example, U.S. Pat. No. 2,941,956, JP-A No. S47-33279, J. Org. Chem. 28, 2069-2075 (1963), or Chemical Review 1981, Vol. 81, No. 4, p 619-621) may be used. Specifically, the carbodiimide compounds described in Japanese Patent No. 4084953 are also usable.

Examples of polycarbodiimide compounds include poly (4,4'-dicyclohexylmethane carbodiimide), poly (N,N'-di-2, 6-diisopropylphenyl carbodiimide), and poly (1,3,5-triisopropylphenylene-2,4-carbodiimide).

Cyclic carbodiimide compounds can be synthesized based on, for example, the method described in JP-A-2011-256337 or the like.

Commercially available products may be used as the carbodiimide compound, and examples thereof include B2756 (trade name) manufactured by Tokyo Chemical Industry Co., Ltd., CARBODILITE LA-1 manufactured by Nisshinbo Chemical Inc., and STABAXOL P, STABAXOL P400, AND STABAXOL I (trade names) manufactured by Rhein-Chemie.

Examples of compounds (isocyanate compounds) containing an isocyanate group in one molecule that can be used as the stabilizer (Y1) include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of compounds (epoxy compounds) containing an epoxy group in one molecule that can be used as the stabilizer (Y1) include phenyl glycidyl ether, diethyleneglycol diglycidyl ether, bisphenol A diglycidyl ether, hydrogenated bisphenol A diglycidyl ether, a phenol novolak type epoxy resin, a cresol novolak type epoxy resin, and epoxidized polybutadiene.

The weight average molecular weight of the stabilizer (Y1) is preferably from 200 to 60,000, more preferably from 200 to 30,000, and still more preferably from 300 to 18,000 as described above. A molecular weight of the stabilizer (Y1) within the above range increases the mobility of the stabilizer (Y1), and improves the moisture and heat resistance of the polymer film (A).

The weight average molecular weight of the stabilizer (Y1) is particularly preferably from 200 to 900. A weight average molecular weight of from 200 to 900 almost matches a number average molecular weight of from 200 to 900. When the weight average molecular weight is from 200 to 900, there are cases where the molecular weight distribution is 1.0, in which case "weight average molecular weight of from 200 to 900" can simply be referred to as "molecular weight of from 200 to 900".

When the polymer film (A) includes a stabilizer (Y1), the polymer film (A) may include one stabilizer (Y1), or two or more stabilizers (Y1).

In a preferable embodiment of the stabilizer (Y1), a stabilizer (Y1a) having a number average molecular weight of from 200 to 900 and having one or more kinds of functional groups selected from the group consisting of a carbodiimide group, an epoxy group, and an isocyanate group, and a stabilizer (Y1b) having a weight average molecular weight of from 1,000 to 60,000 and having two or more functional groups of one or more kinds selected from the group consisting of a carbodiimide group, an epoxy group, and an isocyanate group in one molecule are used in combination. The weight average molecular weight of the stabilizer (Y1a) having a number average molecular weight of from 200 to 900 is approximately from 200 to 900, and the number average molecular weight and weight average molecular weight of the stabilizer (Y1a) are almost the same.

When the stabilizer (Y1a) and the stabilizer (Y1b) are used in combination as stabilizers, inclusion of a greater amount of the stabilizer (Y1a) is preferable from the viewpoint of improving transparency.

Specifically, from the viewpoint of obtaining both of moisture and heat resistance and transparency, the content of the stabilizer (Y1b) is preferably within a range of from 10 parts by mass to 150 parts by mass, and more preferably in a range of from 50 parts by mass to 100 parts by mass, with respect to 100 parts by mass of the stabilizer (Y1a).

Specific examples (stabilizers Y-1 to Y-3) of the stabilizer (Y1) are shown below.

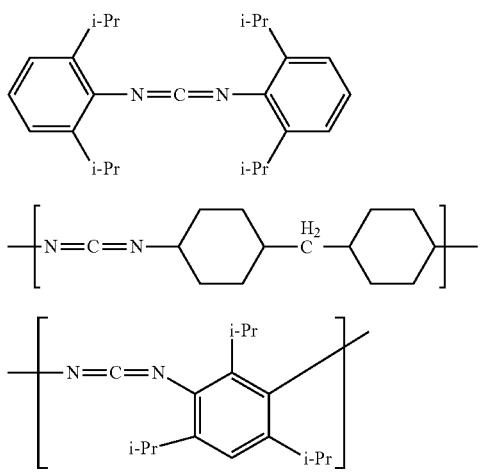

The compound names, commercially available products, and the like of the stabilizers Y-1 to Y-3 are described below.

Stabilizer Y-1: Stabilizer Y-1 has a compound name, bis-2,6-diisopropylphenyl carbodiimide, and a weight average molecular weight (in this example, equivalent to simple "molecular weight") of 363. Examples of commercially available products include STABAXOL I manufactured by Rhein Chemie and B2756 manufactured by Tokyo Chemical Industry Co., Ltd.

Stabilizer Y-2: Stabilizer Y-2 has a compound name, poly (4,4'-dicyclohexylmethane carbodiimide). Examples of commercially available products include CARBODILITE LA-1 manufactured by Nisshinbo Chemical Co., Ltd., which has a weight average molecular weight of about 2,000.

Stabilizer Y-3: Stabilizer Y-3 has a compound name, poly (1,3,5-triisopropylphenylene-2,4-carbodiimide). Examples of commercially available products include STABAXOL P manufactured by Rhein Chemie, which has a weight average molecular weight of about 3,000, and STABAXOL P400 manufactured by Rhein Chemie, which has a weight average molecular weight of about 20,000.

(Stabilizer (Y2))

A compound containing an iminoether group in one molecule (iminoether compound) may be used as the stabilizer (Y2) having an iminoether group. Examples of the iminoether compound include a compound represented by the following Formula (1).

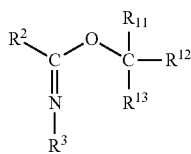

Formula (1)

In Formula (1), $R^2$ represents an alkyl group optionally having a substituent, a cycloalkyl group optionally having a substituent, an aryl group optionally having a substituent, or a an alkoxy group optionally having a substituent, $R^3$ represents an alkyl group represented by the following Formula (2) or an aryl group represented by the following Formula (3), and $R^{11}$, $R^{12}$, and $R^{13}$ each independently represent a hydrogen atom, an alkyl group optionally having a substituent, or an aryl group optionally having a substituent. $R^2$, $R^3$, $R^{11}$, $R^{12}$, and $R^{13}$ may be bonded to each other to form a ring, provided that, when $R^3$ is represented by the following Formula (2) and a bond is formed between at least one of $R^{11}$ to $R^{13}$ and at least one of $R^{31}$ to $R^{33}$, the bond involves two or more connecting atoms.

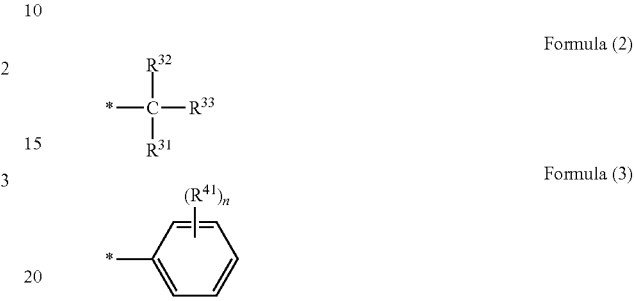

In Formula (2), $R^{31}$, $R^{32}$, and $R^{33}$ each independently represent a hydrogen atom or a substituent. $R^{31}$, $R^{32}$, and $R^{33}$ may be bonded to each other to form a ring. In Formula (3), $R^{41}$ represents a substituent. When two or more $R^{41}$s are present, $R^{41}$s may be the same as or different from each other. Further, n represents an integer from 0 to 5. In Formulae (2) and (3), * represents the position of bonding to the nitrogen atom.

In Formula (1), the alkyl group represented by $R^2$ is preferably an alkyl group having 1 to 20 carbon atoms, and more preferably an alkyl group having 1 to 12 carbon atoms. The alkyl group represented by $R^2$ may be linear or branched. The alkyl group represented by $R^2$ may be a cycloalkyl group. Examples of the alkyl group represented by $R^2$ include a methyl group, an ethyl group, an n-propyl group, an iso-propyl group, an n-butyl group, a tert-butyl group, a sec-butyl group, an iso-butyl group, an n-pentyl group, a sec-pentyl group, an iso-pentyl group, an n-hexyl group, a sec-hexyl group, an iso-hexyl group, and a cyclohexyl group. Among these groups, the alkyl group represented by $R^2$ is more preferably a methyl group, an ethyl group, an n-propyl group, an iso-propyl group, an iso-butyl group, or a cyclohexyl group.

The alkyl group represented by $R^2$ may itself have a substituent. Examples of the substituent include an alkyl group such as those described above, an aryl group, an alkoxy group, a halogen atom, a nitro group, an amide group, a hydroxyl group, an ester group, an ether group, and an aldehyde group. The number of carbon atoms indicated for the alkyl group represented by $R^2$ refers to the number of carbon atoms excluding the carbon atoms of any substituents.

The aryl group represented by $R^2$ is preferably an aryl group having 6 to 20 carbon atoms, and more preferably an aryl group having 6 to 12 carbon atoms. Examples of the aryl group represented by $R^2$ include a phenyl group and a naphthyl group. Among these groups, a phenyl group is particularly preferable. The aryl group represented by $R^2$ may itself have a substituent. Examples of the substituents include the above-described substituents. The number of carbon atoms indicated for the aryl group represented by $R^2$ refers to the number of carbon atoms excluding the carbon atoms of any substituents.

The alkoxy group represented by $R^2$ is preferably an alkoxy group having 1 to 20 carbon atoms, more preferably an alkoxy group having 1 to 12 carbon atoms, and particularly preferably an alkoxy group having 2 to 6 carbon atoms. The alkoxy group represented by $R^2$ may be linear, branched, or cyclic. Preferable examples of the alkoxy group represented by $R^2$ include a group formed by an alkyl group exemplified for $R^2$ and —O— connected to a terminal of the alkyl group. The alkoxy group represented by $R^2$ may itself have a substituent. Examples of the substituent include the above-described substituents. The number of carbon atoms indicated for the alkoxy group represented by $R^2$ refers to the number of carbon atoms excluding the carbon atoms of any substituents.

$R^3$ represents an alkyl group represented by Formula (2) or an aryl group represented by Formula (3). In Formula (2), $R^{31}$, $R^{32}$, and $R^{33}$ each independently represent a hydrogen atom or a substituent. When $R^{31}$, $R^{32}$ or $R^{33}$ represents a substituent, $R^{31}$, $R^{32}$ or $R^{33}$ may be bonded to another of $R^{31}$, $R^{32}$ or $R^{33}$ to form a ring. Examples of the substituent include an alkyl group such as those described above, an aryl group, an alkoxy group, a halogen atom, a nitro group, an amide group, a hydroxyl group, an ester group, an ether group, and an aldehyde group. It is contemplated that $R^{31}$, $R^{32}$, and $R^{33}$ may all be hydrogen atoms, or that $R^{31}$, $R^{32}$, and $R^{33}$ may all be the same substituent, or that $R^{31}$, $R^{32}$, and $R^{33}$ may be different substituents. The alkyl group represented by Formula (2) may be linear or branched. The alkyl group represented by Formula (2) may be a cycloalkyl group.

In Formula (3), $R^{41}$ represents a substituent, and n represents an integer from 0 to 5. When n is 2 or greater, $R^{41}$s may be the same as or different from each other. Examples of the substituent include the above-described substituents. Moreover, n is more preferably from 0 to 3, and still more preferably from 0 to 2.

$R^{11}$, $R^{12}$, and $R^{13}$ each independently represent a hydrogen atom, an alkyl group optionally having a substituent, or an aryl group optionally having a substituent. Examples of the alkyl group and the aryl group include the alkyl groups and the aryl groups exemplified for the alkyl or aryl group represented by $R^2$.

Although it is preferable that $R^2$, $R^3$, $R^{11}$, $R^{12}$, and $R^{13}$ do not form a ring by mutual bonding, $R^2$, $R^3$, $R^{11}$, $R^{12}$, or $R^{13}$ may be bonded to another of $R^2$, $R^3$, $R^{11}$, $R^{12}$, or $R^{13}$ to form a ring. For example, when $R^3$ is represented by Formula (3), $R^{41}$ and at least one of $R^{11}$ to $R^{13}$ may be bonded to each other to form a ring, and the benzene ring and a ring containing any one of $R^{11}$ to $R^{13}$ may form a condensed ring. When $R^3$ is represented by Formula (3), it is preferable that ring formation by mutual bonding of $R^{41}$ and at least one of $R^{11}$ to $R^{13}$ does not occur.

However, when $R^3$ is represented by Formula (2) and a bond is formed between at least one of $R^{11}$ to $R^{13}$ and at least one of $R^{31}$ to $R^{33}$, the bond involves two or more connecting atoms. When $R^3$ is represented by Formula (2) and a bond is formed between one of $R^{11}$ to $R^{13}$ and one of $R^{31}$ to $R^{33}$, the bond is preferably a double bond in which two or more connecting atoms are involved. When $R^3$ is represented by Formula (2), it is preferable that ring formation by mutual bonding of at least one of $R^{11}$ to $R^{13}$ and at least one of $R^{31}$ to $R^{33}$ does not occur.

Formula (1) may include a repeating unit. In this case, at least one of $R^2$, $R^3$, $R^{11}$, $R^{12}$ or $R^{13}$ is a repeating unit, and this repeating unit preferably includes an iminoether group.

The molecular weight of the stabilizer (Y2) per one iminoether group is preferably 1,000 or less, more preferably 750 or less, and still more preferably 500 or less.

The molecular weight of the stabilizer (Y2)—that is, the molecular weight of the whole iminoether compound—is preferably 280 or more, and more preferably 300 or more.

When the polymer film (A) includes a stabilizer (Y2), the polymer film (A) may include one stabilizer (Y2), or two or more stabilizers (Y2).

The descriptions in paragraphs [0015] to [0063] of International Publication pamphlet WO2015/194661 can be referenced with respect to the compound represented by Formula (1).

[Other Components]

The polymer film (A) may include other components, if necessary.

Examples of other components include known resins such as polyethylene resins and polystyrene resins, known inorganic fillers such as silica, hydroxyapatite, and montmorillonite, known crystal nucleating agents such as phthalocyanine, and stabilizers other than the stabilizer (Y).

Examples of inorganic fillers and crystal nucleating agents include the components described in paragraphs [0057] and [0058] of International Publication pamphlet WO2013/054918.

<Properties of Polymer Film (A)>

[Standardized Molecular Orientation MORc]

The polymer film (A) according to the present disclosure has a standardized molecular orientation MORc of from 1.0 to 15.0, preferably of from 2.0 to 15.0, more preferably of from 3.5 to 15.0, still more preferably of from 3.5 to 10.0, and further more preferably of from 4.0 to 8.0.

The standardized molecular orientation MORc is a value determined based on molecular orientation ratio MOR, which is an index indicating the degree of orientation of an organic piezoelectric material.

When the standardized molecular orientation MORc is within a range of from 1.0 to 15.0, the strength of the film (the polymer film (A)) is maintained high, and a decrease in the strength of the film in a specific direction (for example, a film in-plane direction orthogonal to the main stretching direction) is suppressed.

When the MORc is within a range of from 2.0 to 15.0, the number of molecular chains of the organic piezoelectric material extending in the stretching direction increases, as a result of which, when the polymer film (A) is used as a piezoelectric film, the piezoelectric film exhibits a high piezoelectric property due to an increase in the ratio of oriented crystal formation.

Here, the molecular orientation ratio (MOR) is measured by the following microwave measurement method. Specifically, the polymer film (A) is disposed in a microwave resonance waveguide of a well-known microwave transmission molecular orientation analyzer (also referred to as a microwave molecular orientation ratio measuring device) such that a face (film face) of the polymer film (A) is perpendicular to the traveling direction of the microwave. Then, the polymer film (A) is rotated from 0 to 360° in a plane perpendicular to the traveling direction of the microwave in a state in which the sample is continuously irradiated with the microwave having an oscillation direction that is biased to one direction, and the intensity of the microwave that has passed through the sample is measured. The molecular orientation ratio MOR is determined therefrom.

The standardized molecular orientation MORc is a molecular orientation ratio MOR with a reference thickness tc of 50 μm, and can be determined according to the following equation.

$$MORc = (tc/t) \times (MOR - 1) + 1$$

(tc: the reference thickness toward which the correction is to be made, t: the thickness of polymer film (A))

The standardized molecular orientation MORc can be measured using a known molecular orientation meter—for example, a microwave molecular orientation meter MOA-2012A or MOA-6000 manufactured by Oji Scientific Instruments Co., Ltd.—at a resonance frequency around 4 GHz or 12 GHz.

For example, when the polymer film (A) is a stretched film, the standardized molecular orientation MORc can be controlled by, for example, heat treatment conditions (heating temperature and heating time) before stretching and stretching conditions (stretching temperature and stretching velocity).

The standardized molecular orientation MORc can also be converted into a birefringence Δn, which is a value obtained by dividing a phase difference (retardation) by the thickness of the film. The retardation can be measured using a RETS100 manufactured by Otsuka Electronics Co., Ltd. Further, MORc and Δn are approximately linearly proportional to each other, and MORc would be 1 when Δn is 0.

For example, when the organic piezoelectric material is a polylactic acid-based polymer and the birefringence Δn of the polymer film (A) is measured at a measurement wavelength of 550 nm, a standardized molecular orientation MORc of 2.0 can be converted into a birefringence Δn of 0.005, and a standardized molecular orientation MORc of 4.0 can be converted into a birefringence Δn of 0.01.

[Degree of Crystallinity]

The degree of crystallinity of the polymer film (A) according to the present disclosure is a value measured using a DSC method. The degree of crystallinity of the polymer film (A) according to the present disclosure is from 20% to 80%, preferably from 20% to 70%, and more preferably from 20% to 50%.

Due to the degree of crystallinity being 20% or more, the strength of the film (polymer film (A)) is ensured. Due to the degree of crystallinity being 80% or less, the transparency of the film can be maintained high. Further, when the degree of crystallinity is within the above range, occurrence of whitening or breaking during stretching of the film is reduced, and the film is easy to produce.

A degree of crystallinity of the polymer film (A) of 20% or more is also advantageous in terms of improvement in heat resistance, and in terms of an improvement in the piezoelectric property (piezoelectric coefficient) in the case of using the polymer film (A) as a piezoelectric film.

[Product of Standardized Molecular Orientation MORc and Degree of Crystallinity]

In the polymer film (A) according to the present disclosure, the product of the standardized molecular orientation MORc at a reference thickness of 50 μm as measured by a microwave transmission molecular orientation analyzer and the degree of crystallinity as measured by a DSC method is preferably from 20 to 700, more preferably from 40 to 700, more preferably from 70 to 700, more preferably from 75 to 680, more preferably from 90 to 660, more preferably from 100 to 650, and more preferably from 100 to 350.

When the product of the standardized molecular orientation MORc and the degree of crystallinity obtained by a DSC is within a range of from 20 to 700, a favorable transparency and a favorable dimensional stability are maintained.

When the product of the standardized molecular orientation MORc and the degree of crystallinity as measured by a DSC is within a range of from 40 to 700 (preferably from 70 to 700), a favorable piezoelectric property is maintained in the case of using the polymer film (A) as a piezoelectric film.

[Transparency (Internal Haze)]

The polymer film (A) according to the present disclosure has an internal haze with respect to visible light (hereinafter also referred to simply as "internal haze") of 50% or less, preferably 40% or less, more preferably 20% or less, more preferably 15% or less, more preferably 13% or less, more preferably 5% or less, and more preferably 1% or less. A lower internal haze of the polymer film (A) is more favorable from the viewpoint of transparency, and the lower limit thereof is not particularly limited. The internal haze in the present disclosure may be, for example, 0.1% or more. An internal haze of 0.1% or more is favorable from the viewpoint of further increasing the piezoelectric coefficient in the case of, for example, using the polymer film (A) as a piezoelectric film.

In the present disclosure, the "internal haze" refers to a haze excluding a haze resulting from the shape of the outer surface of the polymer film (A). The "internal haze" as used herein is a value obtained by measurement performed on the polymer film (A) at 25° C. in accordance with JIS-K7105.

An example of the method of measuring the internal haze is later-described in Examples.

[Piezoelectric Coefficient (Stress-Charge Method)]

The polymer film (A) according to the present disclosure is suitably used, for example, as a piezoelectric film. When the polymer film (A) is used as a piezoelectric film, the piezoelectric coefficient of the polymer film (A) (piezoelectric film) refers to a value measured as follows.

First, the polymer film (A) is cut into a piece having a size of 150 mm in a direction at an angle of 45° with respect to the stretching direction (for example, the MD direction) of the polymer film (A) and 50 mm in a direction orthogonal to the direction at an angle of 45° with respect to the stretching direction, prepare a rectangular test piece. Subsequently, the obtained test piece is set on a test stand SIP-600 manufactured by Showa Shinku Co., Ltd., and Al is deposited on one face of the test piece to an Al deposition thickness of about 50 nm. Subsequently, Al is also deposited on the other face of the test piece in a similar manner. Thus, an Al conductive layer is formed on each face of the test piece.

A test piece (polymer film (A)) of 150 mm×50 mm provided with an Al conductive layer formed on each face is cut to have a size of 120 mm in the direction at an angle of 45° with respect to the stretching direction (for example, the MD direction) of the polymer film (A) and 10 mm in the direction orthogonal to the direction at an angle of 45° with respect to the stretching direction, thereby obtaining a rectangular film having a size of 120 mm×10 mm. This film is used as a piezoelectric coefficient measurement sample.

The obtained sample is set in a tensile tester (TENSILON RTG-1250 manufactured by A&D Company, Limited) with an inter-chuck distance set to 70 mm without slackness. A force is periodically applied at a crosshead speed of 5 mm/min such that the applied force alternates between 4 N and 9 N. In order to measure the amount of charge generated in response to the applied force in the above process, a capacitor having a capacitance Qm (F) is connected to the sample in parallel, and an inter-terminal voltage Vm of this capacitor Cm (95 nF) is measured via a buffer amplifier. The amount of charge Q (C) generated is calculated as a product of the capacity Cm of the capacitor and the inter-terminal voltage Vm. The piezoelectric coefficient $d_{14}$ is calculated according to the following equation.

$$d_{14}=(2\times t)/L\times Cm\cdot \Delta Vm/\Delta F$$

t: Sample Thickness (m)
L: Inter-chuck Distance (m)
Cm: Capacity (F) of Parallel Connection Capacitor
$\Delta Vm/\Delta F$: Ratio of Change in Voltage between Capacitor Terminals relative to Change in Force A greater piezoelectric coefficient provides a greater displacement of the film in response to a voltage applied to the polymer film (A), and a greater voltage is generated in response to a force applied to the polymer film (A), thereby providing a higher usefulness as the polymer film (A).

Specifically, the piezoelectric coefficient $d_{14}$ as measured by a stress-charge method at 25° C. is preferably 1 pC/N or more, more preferably 3 pC/N or more, and still more preferably 4 pC/N or more. The upper limit of the piezoelectric coefficient is not particularly limited. The piezoelectric coefficient of the polymer film (A) in which an organic piezoelectric material is used is preferably 50 pC/N or less, and more preferably 30 pC/N or less, from the viewpoint of balance with transparency or the like described below.

Similarly from the viewpoint of balance with transparency, the piezoelectric coefficient $d_{14}$ as measured by a stress-charge method is preferably 15 pC/N or less.

The polymer film (A) according to the present disclosure preferably has an internal haze of 40% or less with respect to visible light and a piezoelectric coefficient $d_{14}$ of 1 pC/N or more as measured by a stress-charge method at 25° C. Preferable ranges of the internal haze with respect to visible light and the piezoelectric coefficient $d_{14}$ measured by a stress-charge method at 25° C. are respectively as described above.

The polymer film (A) according to the present disclosure may be a single layer film or a layered film.

[Thickness]

The thickness of the polymer film (A) according to the present disclosure is not particularly limited. The thickness of the polymer film (A) is, for example, from 10 µm to 1000 µm, and is preferably from 10 µm to 400 µm, more preferably from 20 µm to 200 µm, still more preferably from 20 µm to 100 µm, and particularly preferably from 30 µm to 80 µm.

When the polymer film (A) is a layered film formed of plural layers, the above thickness refers to the thickness of the entire layered film.

<Method of Producing Polymer Film (A)>

Methods used for producing the polymer film (A) according to the present disclosure are not particularly limited. The polymer film (A) can be manufactured, for example, by mixing a raw material of the polymer film (A) (an organic piezoelectric material such as a helical chiral polymer (X), for example, the above-described polylactic acid-based polymer) and, if necessary, other components (such as stabilizers (Y) and inorganic fillers), and subjecting the mixture to extrusion film-forming using a film-forming machine.

Methods used for producing a piezoelectric film as the polymer film (A) are not particularly limited, either. For example, the descriptions in paragraphs [0065] to [0099] of International Publication pamphlet WO2013/054918 can be referenced, as appropriate.

Examples of preferable methods of producing the polymer film (A) (piezoelectric film) include a method of producing the polymer film (A) including: a first step of obtaining a preliminarily crystallized film containing a raw material of the polymer film (A); and a second step of stretching the preliminarily crystallized film mainly in a uniaxial direction (and, further, a step of performing an annealing treatment, if necessary).

Another preferable production method is a method of producing the polymer film (A) including a step of stretching a film containing a raw material of the polymer film (A) mainly in a uniaxial direction and a step of performing an annealing treatment in this order.

<Protective Film (B)>

The layered body according to the present disclosure includes a peelable protective film (B) that contacts one main face of the polymer film (A).

As described above, the layered body according to the present disclosure may further include another peelable protective film that contacts the other main face of the polymer film (A).

Examples of the material of the protective film (B) include polyolefin-based resins, polyethylene terephthalate-based resins, polyester resins (excluding polyethylene terephthalate-based resins), nylon resins, polyvinyl alcohol resins, polyvinylidene chloride resins, polystyrene resins, polyvinyl chloride resins, polycarbonate resins, polymethyl methacrylate resins, polyurethane resins, fluorocarbon resins, polyacrylonitrile resins, polybutene resins, polyimide resins, polyarylate resins, and acetyl cellulose resins.

These resins may be used singly or in mixture of two or more thereof.

Among these resins, polyolefin-based resins and polyethylene terephthalate-based resins are preferable from the viewpoint of alleviating deterioration in appearance of the polymer film (A) after the protective film (B) is peeled off. These resins may be used singly or in combination of two or more thereof.

The protective film (B) may be a multilayer body formed from layers of these resins.

Examples of polyolefin-based resins include olefin homopolymers, copolymers of two or more olefins, and copolymers of an olefin and another monomer.

Examples of olefin homopolymers include: α-polyolefins such as polyethylene, polypropylene, polybutene, and polymethylpentene; and cyclic polyolefins. Examples of copolymers of two or more olefins include ethylene-propylene copolymers, propylene-ethylene-butylene copolymers, and ethylene-1-butene copolymers.

Examples of polyethylene terephthalate-based resins include: a polyethylene terephthalate resin generated by polycondensation of terephthalic acid and ethylene glycol; a polybutylene terephthalate resin generated by polycondensation of terephthalic acid and tetramethylene glycol; a polycyclohexane dimethylene terephthalate resin generated by polycondensation of terephthalic acid and 1,4-cyclohexanedimethanol; a polyethylene terephthalate resin generated by co-polycondensation of terephthalic acid, isophthalic acid, and ethylene glycol; a polyethylene terephthalate resin generated by co-polycondensation of terephthalic acid, ethylene glycol, and 1,4-cyclohexanedimethanol; and a polyethylene terephthalate resin generated by co-polycondensation of terephthalic acid, isophthalic acid, ethylene glycol, and propylene glycol. The polyethylene terephthalate-based resins may include structural units derived from other monomers.

[Base Material Layer]

The protective film (B) preferably includes a base material layer and a pressure-sensitive adhesive layer that is disposed on a main face of the base material layer which faces the polymer film (A).

Examples of the material of the base material layer include the materials above-exemplified materials for the protective film (B). Among the above resins, polyolefin-based resins and polyethylene terephthalate-based resins are preferable as the base layer material from the viewpoint of alleviating deterioration in appearance of the polymer film (A) after the protective film (B) is peeled off. That is, the base material layer is preferably formed from a polyolefin-based resin and/or a polyethylene terephthalate-based resin.

These resins may be used singly or in combination of two or more thereof.

The base material layer may be a multilayer body formed from layers of these resins.

[Pressure-Sensitive Adhesive Layer]

Examples of a material of the pressure-sensitive adhesive layer include pressure-sensitive ethylene-vinyl acetate copolymer (EVA)-based adhesives, pressure-sensitive acrylic adhesives, pressure-sensitive rubber-based adhesives, pressure-sensitive polyolefin-based adhesives (for example, pressure-sensitive polyethylene oligomer adhesives), pressure-sensitive cellulose-based adhesives (for example, pastes), pressure-sensitive silicone-based adhesives, pressure-sensitive urethane-based adhesives, pressure-sensitive vinyl alkyl ether-based adhesives, pressure-sensitive polyvinyl alcohol-based adhesives, pressure-sensitive polyvinyl pyrrolidone-based adhesives, and pressure-sensitive polyacrylamide-based adhesives. Among these pressure-sensitive adhesives, pressure-sensitive acrylic adhesives, pressure-sensitive urethane-based adhesives, and pressure-sensitive silicone-based adhesives are preferable as the material of the pressure-sensitive adhesive layer from the viewpoint of alleviating deterioration in appearance of the polymer film (A) after the protective film (B) is peeled off. In particular, the pressure-sensitive adhesive layer preferably includes a pressure-sensitive acrylic adhesive.

These pressure-sensitive adhesives may be used singly, or in combination of two or more thereof. The pressure-sensitive adhesive layer may be a multilayer body. An antistatic agent may be added to the pressure-sensitive adhesive layer in order to prevent electrification upon peeling.

Preferable examples of pressure-sensitive adhesive polymers for pressure-sensitive acrylic adhesives include copolymers containing a (meth)acrylate in which the alkyl group has 1 to 10 carbon atoms, such as 2-ethylhexyl acrylate, butyl acrylate, isooctyl acrylate, butyl methacrylate, or propyl methacrylate, and a functional group-containing unsaturated monomer such as acrylic acid, methacrylic acid, maleic acid, fumaric acid, hydroxyethyl acrylate, or hydroxyethyl methacrylate.

In the layered body according to the present disclosure, it is preferable that the base material layer is formed from a polyolefin-based resin or a polyethylene terephthalate-based resin, and that the pressure-sensitive adhesive layer includes a pressure-sensitive acrylic adhesive, from the viewpoint of alleviating deterioration in appearance of the polymer film (A) after the protective film (B) is peeled off.

[Acid Value of Pressure-Sensitive Adhesive Layer]

The pressure-sensitive adhesive layer has an acid value of preferably 10 mg KOH/g or less, more preferably from 0.01 mg KOH/g to 10 mg KOH/g, still more preferably from 0.05 mg KOH/g to 5 mg KOH/g, further more preferably from 0.1 mg KOH/g to 1 mg KOH/g.

When the acid value of the pressure-sensitive adhesive layer is more than 0 mg KOH/g, an interaction occurs between a polar group of the pressure-sensitive adhesive layer and a polar group of the polymer film (A), as a result of which the adhesive strength between the pressure-sensitive adhesive layer and the polymer film (A) increases.

When the acid value of the pressure-sensitive adhesive layer is 10 mg KOH/g or less, a decrease in the molecular weight of the organic piezoelectric material contained in the polymer film (A) is suppressed, as a result of which the stability of the polymer film (A) improves.

In the layered body according to the present disclosure, the acid value of the pressure-sensitive adhesive layer refers to the amount (mg) of KOH required for neutralizing a free acid in 1 g of the pressure-sensitive adhesive layer. The amount (mg) of KOH is measured by titrating a pressure-sensitive adhesive layer dissolved or swollen in a solvent with a 0.005 M KOH (potassium hydroxide) ethanol solution using phenolphthalein as an indicator.

<Characteristics of Protective Film (B)>

[Maximum Indentation Depth h max]

In the present disclosure, the maximum indentation depth h max obtained by measuring a face of the protective film (B) that contacts the polymer film (A) by a nanoindentation method is specified to be from 53 nm to 100 nm from the viewpoint of alleviating deterioration in appearance of the polymer film (A) after the protective film (B) is peeled off. Note that measurement of the maximum indentation depth h max by the nanoindentation method is performed in accordance with ISO 14577-1 (instrumented indentation hardness). Details of the measuring method will be described in detail in Examples.

As described above, the maximum indentation depth h max is from 53 nm to 100 nm, and is preferably from 53 nm to 80 nm, and more preferably from 53 nm to 60 nm.

The sample to be use may be either the protective film (B) before being disposed (laminated) on the main face of the polymer film (A) or the protective film (B) after being peeled from the layered body. In either case, measurement of the maximum indentation depth hmax is performed on a face of the protective film (B) that is to be contacted with the polymer film (A) or that contacted with the polymer film (A).

When the protective film (B) includes the base material layer and the pressure-sensitive adhesive layer, and the protective film (B) and the polymer film (A) are affixed to each other via the pressure-sensitive adhesive layer, the maximum indentation depth h max of the protective film (B) is a maximum indentation depth obtained by measuring the pressure-sensitive adhesive layer side of the protective film (B). In this case, the maximum indentation depth h max is regarded as the maximum indentation depth h max of the pressure-sensitive adhesive layer.

[T-Peel Strength]

In the present disclosure, the T-peel strength between the protective film (B) and the polymer film (A) is preferably from 0.07 N/50 mm to 1 N/50 mm, more preferably from 0.07 N/50 mm to 0.5 N/50 mm, and still more preferably from 0.10 N/50 mm to 0.3 N/50 mm, from the viewpoint of alleviating deterioration in appearance of the polymer film (A) after the protective film (B) is peeled off.

The "T-peel strength" is a value obtained by measurement in accordance with JIS K6854-3 (1999) using a tensile tester (TENSILON RTG-1250 manufactured by A&D Company, Limited) at 25° C. Details of the measuring method will be described in detail in Examples.

[Thickness]

The thickness of the protective film (B) is not particularly limited. The thickness of the protective film (B) is preferably in a range of 5 μm or more, more preferably in a range of from 10 μm to 100 μm, still more preferably in a range of from 20 μm to 80 μm, and particularly preferably in a range of from 30 μm to 50 μm, from the viewpoint of enhancing its protective function.

When the protective film (B) includes a base material layer and a pressure-sensitive adhesive layer, the thickness of the base material layer is preferably in a range of from 9 μm to 99 μm, more preferably in a range of from 19 μm to 79 μm, and still more preferably in a range of from 29 μm to 49 μm.

The thickness of the pressure-sensitive adhesive layer is preferably in a range of from 1 μm to 20 μm, and more preferably in a range of from 3 μm to 10 μm.

The protective film (B) according to the present disclosure may be a single layer film or a layered film having, for example, a base material layer and a pressure-sensitive adhesive layer as described above.

When the protective film (B) is a single layer film, the protective film (B) is affixed to the polymer film (A) due to, for example, adhesiveness of the protective film (B) itself or an electrostatic attractive force. When the protective film (B) is a layered film, the protective film (B) may include a functional layer.

Examples of the functional layer include an easy adhesion layer, a hard coat layer, an antistatic layer, an antiblock layer, a protective layer, an oligomer block layer, and an electrode layer. These functional layers may be disposed on a main face of the protective film (B) that faces the polymer film (A) or disposed on a main face of the protective film (B) at the opposite side from the polymer film (A), depending on the purpose. The protective film (B) may include two or more functional layers.

In the layered body according to the present disclosure, the elastic modulus of the protective film (B) and the elastic modulus of the polymer film (A) preferably satisfy the following Relational Expression (F).

Elastic Modulus of Protective Film ($B$)/Elastic Modulus of Protective Film ($A$)≥0.1    Expression (F)

There are cases where polymer films including an organic piezoelectric material to which a protective film is attached are stored in a rolled state for a long time. The present inventors have found that polymer films containing an organic piezoelectric material slightly shrink in the stretching direction during a long-term storage in a roll state and become to have a decreased planarity, due to the polymer films having been stretched in one direction in order to impart a piezoelectric property. The decrease in planarity may cause deterioration of the appearance and quality of devices manufactured using the polymer films.

The present inventors have found that, due to the ratio of the elastic modulus of the protective film (B) to the elastic modulus of the polymer film (A) being set to 0.1 or more as represented by the above Expression (F), shrinkage and deformation of the polymer film (A) are reduced and a decrease in planarity is suppressed in the layered body according to the present disclosure even when the protective film (B) is peeled off after the layered body has been stored in a rolled state for a period as long as one year or longer.

In other words, by satisfying the above Expression (F), a further effect is obtained in that the planarity of the polymer film can be maintained without shrinkage and deformation of the polymer film even when the protective film is peeled off after long-term storage in a rolled state.

When the ratio of the elastic modulus of the protective film (B) to the elastic modulus of the polymer film (A) is 10 or less, peeling points upon peeling of the protective film (B) are stable, and the appearance quality of the polymer film (A) further improves. When the ratio of the elastic modulus of the protective film (B) to the elastic modulus of the polymer film (A) is 0.3 or more, a decrease in planarity is more strongly suppressed.

When the protective film (B) is a layered film including a base material layer and a pressure-sensitive adhesive layer, the elastic modulus of the protective film (B) in Expression F is preferably a composite elastic modulus of the base material layer and the pressure-sensitive adhesive layer in the protective film (B).

In the present disclosure, the elastic modulus of each film means a value obtained by measuring an elastic modulus based on JIS K7127 (1999). Specifically, the measurement may be performed as follows. A sample having a size of 100 mm in the main stretching direction of the polymer film containing an organic piezoelectric material and 20 mm in a direction perpendicular to the main stretching direction of the polymeric piezoelectric film is cut out from the layered body, the sample that has been cut out is separated into the polymeric piezoelectric film and the protective film, and the elastic modulus of the polymeric piezoelectric film and the elastic modulus of the protective film are measured in accordance with JIS K7127 (1999) with an inter-chuck distance of 70 mm and a velocity of 50 mm/min using a tensile tester (TENSILON RTG-1250 (trade name) manufactured by A&D Company, Limited). The polymer film containing an organic piezoelectric material may have anisotropy due to stretching, and the elastic modulus in the main stretching direction is measured in the present disclosure.

In the layered body according to the present disclosure, it is preferable that the protective film (B) is a layered film including a base material layer and a pressure-sensitive adhesive layer, that the base material layer is formed from a polyethylene terephthalate-based resin, and that the pressure-sensitive adhesive layer includes a pressure-sensitive acrylic adhesive, from the viewpoint of more strongly suppressing a decrease in planarity.

By adopting such a configuration, the rigidity of the film is enhanced, as a result of which deformation due to shrinkage of the polymer film (A) is reduced and a decrease in planarity is suppressed even when the protective film (B) is peeled off after the layered body has been stored in a rolled state for a period as long as one year or longer.

<Method of Forming Protective Film (B)>

Known methods that has been conventionally used can be used, as appropriate, as a method of forming the protective film (B). For example, the protective film (B) can be formed by performing film-forming by extrusion using a resin for forming the protective film (B) and a film-forming machine.

When the protective film (B) is a multilayer film formed of plural layers including a base material layer and a pressure-sensitive adhesive layer, the multilayer film may be prepared, for example, by affixing an already-formed base material layer, a already-formed pressure-sensitive adhesive layer, and, if necessary, one or more other layers (for example, a functional layer) to one another, or by film-forming a pressure-sensitive adhesive layer and one or more other layers by extrusion on an already-formed base material layer. The multilayer film may alternatively be formed by co-extruding a material for forming a base material layer, a material for forming a pressure-sensitive adhesive layer, and the like to form films, using a multilayer film-forming machine. A pressure-sensitive adhesive layer may be formed on a base material layer using a wet coating method. In this case, the pressure-sensitive adhesive layer can be formed by applying, to the base material layer, a coating liquid (coating liquid for forming a pressure-sensitive adhesive layer) in which materials (a resin, an additive, and the like) for forming the pressure-sensitive adhesive layer are dispersed or dissolved.

A surface of the protective film (B) may be treated, for example, by a corona treatment, an itro treatment, an ozone treatment, or a plasma treatment, with a view to improving the peelability of the protective film (B).

Examples of commercially available products for the protective film (B) include: PAC series, JA series, KD series, MA series, and NSA series available from Sun A. Kaken Co., Ltd.; 622 series available from Sekisui Chemical Co., Ltd.; FM series available from Daio Paper Converting Co., Ltd.; V series available from Sumiron Co., Ltd.; E-MASK series available from Nitto Denko Corporation; Mitsui masking tape available from Mitsui Chemicals Tohcello, Inc.; protect film series available from Toyohozai Co., Ltd.; industrial pressure-sensitive adhesive tape series and pressure-sensitive weakly adhesive tape series available from LINTEC Corporation; EM series available from Higashiyama Film Corporation; and PROSAVE series available from Kimoto.

<Another Protective Film>

As described above, the layered body according to the present disclosure may further include another peelable protective film that contacts the other main face of the polymer film (A).

When the layered body according to the present disclosure further includes another peelable protective film that contacts the other main face of the polymer film (A), protective films such as those exemplified for the protective film (B) may be used as another protective film. Another protective film and the protective film (B) may be the same as or different from each other.

First Embodiment

FIG. 1 is a cross-sectional view illustrating a first embodiment of the layered body according to the present disclosure. A layered body 10 according to the first embodiment includes a polymer film 12 and a protective film 14. In the layered body 10 according to the first embodiment, the protective film 14 is affixed to the polymer film 12 by adhesiveness of the protective film 14 itself or an electrostatic attractive force. Owing to the presence of the protective film 14, a surface of the polymer film 12 can be protected.

In the layered body 10 according to the first embodiment, the maximum indentation depth h max of the protective film 14 is adjusted to be within a range of from 53 nm to 100 nm.

Therefore, according to the layered body 10 according to the first embodiment, deterioration in appearance of the polymer film 12 after the protective film 14 is peeled therefrom is alleviated.

Second Embodiment

Figure 2:
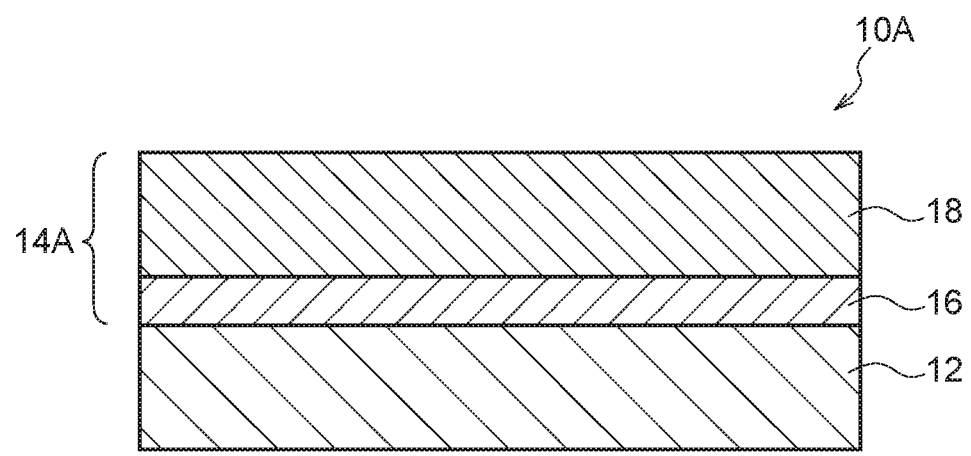
FIG. 2 is a cross-sectional view illustrating a second embodiment of the layered body according to the present disclosure.

FIG. 2 is a cross-sectional view illustrating a second embodiment of the layered body according to the present disclosure. A layered body 10A according to the second embodiment includes a polymer film 12, a pressure-sensitive adhesive layer 16, and a base material layer 18 disposed in this order. In the layered body 10A according to the second embodiment, a protective film 14A is composed of the pressure-sensitive adhesive layer 16 and the base material layer 18. In the layered body 10A according to the second embodiment, the protective film 14A is affixed to the polymer film 12 via the pressure-sensitive adhesive layer 16, and, therefore, the adhesive strength between the protective film 14A and the polymer film 12 is enhanced.

In addition, in the layered body 10A according to the second embodiment, the maximum indentation depth h max of the protective film 14A,—that is, the maximum indentation depth h max of the pressure-sensitive adhesive layer 16—is adjusted to be within a range of 53 nm to 100 nm.

Therefore, according to the layered body 10A according to the second embodiment, deterioration in appearance of the polymer film 12 after the protective film 14A is peeled therefrom is alleviated.

<Application of Layered Body>

When the layered body according to the present disclosure includes a piezoelectric film having a piezoelectric property (hereinafter referred to as "piezoelectric film (A1)") as the polymer film (A), the piezoelectric film (A1) obtained after the protective film (B) is peeled therefrom can be used in various fields such as speakers, headphones, touch panels, actuators, remote controllers, microphones, underwater microphones, ultrasonic transducers, ultrasonic applied measuring devices, piezoelectric vibrators, mechanical filters, piezoelectric transformers, delay devices, sensors, force sensors, acceleration sensors, impact sensors, vibration sensors, pressure-sensitive sensors, tactile sensors, electric field sensors, sound pressure sensors, displays, fans, pumps, variable focus mirrors, sound insulating materials, soundproofing materials, keyboards, audio instruments, information processing machines, measuring instruments, and medical instruments.

The piezoelectric film (A1) is preferably used as a piezoelectric element having at least two faces on which an electrode is provided. It suffices that an electrode is provided on at least two faces of the piezoelectric film (A1). The electrode is not particularly limited, and examples of usable electrodes include ITO, ZnO, IZO (registered trademark), and conductive polymers.

A piezoelectric film (A1) and an electrode may be repeatedly stacked to be used as a layered piezoelectric element. Examples thereof include an element obtained by repeatedly stacking a unit composed of an electrode and a piezoelectric film (A1), and lastly covering, with an electrode, a main face of the piezoelectric film (A1) that has not covered with an electrode. Specifically, an element having two repetitions of the unit is a layered piezoelectric element including an electrode, a piezoelectric film (A1), an electrode, a piezoelectric film (A1), and an electrode which are stacked in this order. Among the piezoelectric films (A1) used in the layered piezoelectric element, the piezoelectric film (A1) of one layer is the piezoelectric film (A1) according to the present disclosure, and each of the other layers needs not be the piezoelectric films (A1) according to the present disclosure.

When the layered piezoelectric element includes plural piezoelectric films (A1) and the organic piezoelectric material is a helical chiral polymer (X), in a case where the helical chiral polymer (X) contained in a piezoelectric film (A1) of one layer has an optical activity corresponding to the L-isomer, the helical chiral polymer (X) contained in a piezoelectric film (A1) of another layer may have either an optical activity corresponding to the L-isomer or an optical activity corresponding to the D-isomer. The arrangement of piezoelectric films (A1) may be designed, as appropriate, in accordance with the application of the piezoelectric element.

For example, when a first layer of a piezoelectric film (A1) containing a L-isomer of a helical chiral polymer (X) as a main component is stacked with a second piezoelectric film (A1) containing a L-isomer of a helical chiral polymer (X) as a main component with an electrode provided between the first layer and the second layer, it is preferable to arrange the uniaxial stretching direction (the main stretching direction) of the first piezoelectric film (A1) and the uniaxial stretching direction (the main stretching direction) of the second piezoelectric film (A1) to cross each other, preferably to orthogonally cross each other since the direction of displacement in the first piezoelectric film (A1) and the direction of displacement in the second piezoelectric film (A1) can be thereby made to match each other, and the piezoelectric property of the layered piezoelectric element as a whole is enhanced.

Meanwhile, when a first layer of a piezoelectric film (A1) containing a L-isomer of a helical chiral polymer (X) as a main component is stacked with a second piezoelectric film (A1) containing a D-isomer of a helical chiral polymer (X) as a main component with an electrode provided between the first layer and the second layer, it is preferable to arrange the uniaxial stretching direction (the main stretching direction) of the first piezoelectric film (A1) and the uniaxial stretching direction (the main stretching direction) of the second piezoelectric film (A1) to be substantially parallel to each other since the direction of displacements in the first piezoelectric film (A1) and the direction of displacement in the second piezoelectric film (A1) can thereby be made to match each other, and the piezoelectric property of the layered piezoelectric element as a whole is enhanced.

In particular, when an electrode is disposed on a main face of the piezoelectric film (A1), the electrode to be disposed preferably has transparency. Here, "having transparency" as used in relation to an electrode means, specifically, that the electrode has an internal haze of 50% or less and a total light transmittance of 50% or more.

The piezoelectric element in which the piezoelectric film (A1) according to the present disclosure is used can be used in the above-described various piezoelectric devices such as speakers and touch panels. In particular, piezoelectric elements including an electrode having transparency are suitable for use in, for example, speakers, touch panels, and actuators.

The piezoelectric element in which the layered body according to the present disclosure is used can be applied to the above-described various piezoelectric devices such as speakers and touch panels. In particular, piezoelectric elements including an electrode having transparency are suitable for use in, for example, speakers, touch panels, and actuators.

When the layered body according to the present disclosure includes a polymer film having no piezoelectric property (hereinafter referred to as a "polymer film (A2)") as a polymer film (A), the polymer film (A2) obtained after the protective film (B) is peeled from the layered body according to the present disclosure can be suitably used as, for example, an optical film used for a display device or the like.

<Method of Producing Layered Body>

A method used for producing the layered body according to the present disclosure is not particularly limited. For example, the layered body can be manufactured by producing the polymer film (A) by the above-described method, and affixing the polymer film (A) to the protective film (B) that has been formed by the above-described method.

Each of the polymer film (A) and the protective film (B) may be a film that is produced using a known method, or a film that has been produced in advance.

EXAMPLES

Hereinafter, embodiments of the present invention will be described more specifically with reference to Examples. However, embodiments are not limited to the following Examples as far as the gist of the present disclosure is retained.

<Preparation of Polymeric Piezoelectric Film>

A polylactic acid as a helical chiral polymer (X) (product name: INGEO™ biopolymer, brand name: 4032D) manufactured by Nature Works LLC was prepared as an organic piezoelectric material. Then, 1.0 part by mass of an additive Z described below as a stabilizer (Y) was added to 100 parts by mass of the polylactic acid, and the mixture was dry-blended to prepare a raw material.

The prepared raw material was added into a hopper of an extrusion molding machine, extruded from a T-die while being heated to 210° C., and brought into contact with a casting roll at 50° C. for 0.3 minutes to form a preliminary crystallized sheet having a thickness of 150 µm (preliminary crystallization step). The degree of crystallinity of the preliminary crystallized sheet was measured and found to be 6%.

While the obtained preliminarily crystallized sheet was heated at 70° C., stretching of the preliminary crystallized sheet in a roll-to-roll manner was started at a stretching velocity of 10 m/min, so as to be uniaxially stretched in the MD direction to 3.5-fold (stretching step).

Thereafter, the uniaxially stretched film was brought into contact for 15 seconds with a roll heated to 145° C. in a roll-to-roll manner, and annealed to prepare a polymeric piezoelectric film as the polymer film (A) (annealing treatment step). The thickness of the obtained polymeric piezoelectric film was 47.2 µm.

—Additive Z—

As the additive Z, a mixture of STABAXOL P400 (10 parts by mass) manufactured by Rhein Chemie, STABAXOL I (70 parts by mass) manufactured by Rhein Chemie, and Carbodilite LA-1 (20 parts by mass) manufactured by Nisshinbo Chemical Co., Ltd. was used.

Details of each component in the mixture are as follows.

STABAXOL I: bis-2,6-diisopropylphenyl carbodiimide (molecular weight (=weight average molecular weight): 363)

STABAXOL P400: poly (1,3,5-triisopropylphenylene-2, 4-carbodiimide) (weight average molecular weight: 20,000)

Carbodilite LA-1: poly (4,4'-dicyclohexylmethane carbodiimide) (weight average molecular weight: about 2,000)

<Measurement of Properties of Polylactic Acid>

The optical purity, weight average molecular weight (Mw), and molecular weight distribution (Mw/Mn) of polylactic acid contained in the polymeric piezoelectric film were measured using the methods described above. The results are indicated in Table 1.

<Measurement of Properties of Polymeric Piezoelectric Film>

The melting point Tm, degree of crystallinity, and internal haze of the polymeric piezoelectric film were measured using the following methods. The piezoelectric coefficient $d_{14}$ (stress-charge method) and the standardized molecular orientation MORc were measured using the methods described above. The results are indicated in Table 1.

[Melting Point Tm and Degree of Crystallinity]

10 mg of the polymeric piezoelectric film was accurately weighed out, and measurement was performed using a differential scanning calorimeter (DSC-1 manufactured by Perkin Elmer Co., Ltd.) at a temperature rising rate of 10° C./min to obtain a melting endothermic curve. From the obtained melting endothermic curve, the melting point Tm and the degree of crystallinity were obtained. The results are indicated in Table 1.

[Internal Haze]

The internal haze (hereinafter also referred to as internal haze (H1)) of the polymeric piezoelectric film was obtained using the following method. The results are indicated in Table 1.

First, a haze (H2) (%) was measured in advance by sandwiching only a silicone oil (Shin-Etsu Silicone (trademark) manufactured by Shin-Etsu Chemical Co., Ltd., model number: KF96-100CS) between two glass plates. Subsequently, a haze (H3) (%) was measured by sandwiching the polymeric piezoelectric film having surfaces uniformly coated with the silicone oil between the above two glass plates.

Subsequently, a difference between the measurement values was calculated as indicated in the following formula, to obtain an internal haze (H1) (%) of the polymeric piezoelectric film.

Internal haze (H1)=haze (H3)–haze (H2)

The haze (H2) and the haze (H3) (both of which are expressed by % as the unit) were measured using the following device under the following measurement conditions.

Measuring device: HAZE METER TC-HIIIDPK manufactured by Tokyo Denshoku Co., Ltd.

Sample size: 30 mm in width×30 mm in length

Measurement conditions: in accordance with JIS-K7136 (2000)

Measurement temperature: room temperature (25° C.)

layer structure composed of a base material layer/a pressure-sensitive adhesive layer/a polymeric piezoelectric film was thus prepared. Here, the protective film used was NSA33T manufactured by Sun A. Kaken Co., Ltd.

<Measurement of Characteristics>

The maximum indentation depth h max of the protective film and the T-peel strength between the polymeric piezoelectric film and the protective film were measured according to the following methods.

[Maximum Indentation Depth h max]

The protective film was peeled from the layered body prepared in Example 1, and measurement according to a nanoindentation method was performed on a face of the peeled protective film that had contacted the polymeric piezoelectric film, to measure the maximum indentation depth h max of the protective film.

More specifically, the maximum indentation depth h max was measured according to a penetration control linear load application method by penetrating the indenter into the protective film under a condition of a maximum load of 10 µN, using a SPI3800 manufactured by SII Corporation as an atomic force microscope (AFM) control unit, a Tribo Scope manufactured by Hysitron Corporation as a nanoindentation module unit, and a Berkovich-type indenter made of diamond (three-sided pyramid shape with an apex angle of 142.3°) as an indenter.

The measurement was performed at nine places at room temperature (25° C.). The average value of measurement values at seven places excluding the maximum value and the minimum value among the nine measurement values was taken as the maximum indentation depth h max of the protective film.

The above measurement was performed at room temperature (25° C.). The results are indicated in Table 2.

[T-Peel Strength]

The layered body prepared in Example 1 was stored at room temperature for one month, and then a sample having a size of 50 mm in the TD direction and 150 mm in the MD direction was cut out from the layered body. The protective film and the polymeric piezoelectric film were separated in a length of 30 mm in the MD direction, and set in a tensile tester (TENSILON RTG-1250 manufactured by A&D Company, Limited). The T-peel strength between the polymeric piezoelectric film and the protective film was measured in accordance with JIS K6854-3 (1999).

TABLE 1

| Polylactic Acid | | | Polymeric Piezoelectric Film | | | | | |
|---|---|---|---|---|---|---|---|---|
| Chirality | Mw | Mw/Mn | Optical Purity (% e.e.) | Tm (° C.) | Degree of Crystallinity (%) | MORc | MORc × Degree of Crystallinity | Internal Haze (%) | Piezoelectric Coefficient (pC/N) |
| L | 200,000 | 1.83 | 97.0 | 164.2 | 38.5 | 4.81 | 185 | 0.1 | 6.5 |

Example 1

A protective film (50 µm in thickness) having a layer structure composed of a base material layer (a PET base material)/a pressure-sensitive adhesive layer (a pressure-sensitive acrylic adhesive) was affixed, as a protective film (B), to a main face of the polymeric piezoelectric film, which had been prepared according to the above method, using a laminator in a roll-to-roll manner in an orientation such that the pressure-sensitive adhesive layer faces the main face of the polymeric piezoelectric film. A layered body having a The measurement was performed five times at room temperature (25° C.), and the average value thereof was taken as the T-peel strength. The results are indicated in Table 2. In Table 2, the "T-peel Strength from Piezoelectric Film" indicates the T-peel strength described above.

[Elastic Modulus]

A sample having a size of 100 mm in the main stretching direction of the polymeric piezoelectric film and 20 mm in a direction perpendicular to the main stretching direction of the polymeric piezoelectric film was cut out from the layered body prepared in Example 1. The polymeric piezoelectric film and the protective film in the cut sample was separated. The elastic modulus of each of the polymeric piezoelectric film and the protective film was measured using a tensile tester (TENSILON RTG-1250 manufactured by A&D Company, Limited) in accordance with JIS K7127 (1999) with an inter-chuck distance of 70 mm and a velocity of 50 mm/min.

[Elastic Modulus Ratio]

From the elastic modulus of the polymeric piezoelectric film and the elastic modulus of the protective film obtained by the above measurement, a value of the ratio of the elastic modulus of the protective film to the elastic modulus of the polymeric piezoelectric film was determined and taken as an elastic modulus ratio. The elastic modulus of the polymeric piezoelectric film in Example 1 was 6.2 GPa.

<Evaluations>

[Evaluation of Appearance (Orange Peel Texture) After Removal of Protective Film]

The layered body prepared in Example 1 was stored at room temperature for one month, and then a sample having a size of 300 mm in the TD direction and 300 mm in the MD direction was cut out from the layered body. Then, the protective film was peeled from the layered body. Thereafter, the appearance of a face of the polymeric piezoelectric film on which the protective film had been laminated (an adhesive face for the protective film) was evaluated according to the following criteria.

—Evaluation Criteria—
A: Orange peel texture does not occur at all
B: Orange peel texture slightly occurs
C: Orange peel texture occurs heavily on the entire face

[Evaluation of Planarity after Long-Term Storage]

The layered body prepared in Example 1 was stored at room temperature for one year, and then the protective film was peeled from the layered body. The polymeric piezoelectric film was placed on a flat face of a metal plate, and the appearance thereof was evaluated according to the following criteria.

—Evaluation Criteria—
A: Planarity is maintained
B: Planarity is deteriorated in some parts
C: Planarity is deteriorated on the entire surface The planarity observed in this evaluation is 10 cm-scale undulations on the polymeric piezoelectric film. Therefore, the evaluation of the planarity is a different evaluation of appearance from the evaluation of orange peel texture, which is evaluation of several-millimeters-scale unevenness.

Example 2

Operations similar to Example 1 were performed, except that a protective film (JA13K manufactured by Sun A. Kaken Co., Ltd., thickness: 35 μm) having a layer structure composed of a base material layer (polyolefin base material)/a pressure-sensitive adhesive layer (pressure-sensitive acrylic adhesive) was used as the protective film. The results are indicated in Table 2.

Example 3

Operations similar to Example 1 were performed, except that a protective film (KD23K manufactured by Sun A. Kaken Co., Ltd., thickness: 35 μm) having a layer structure composed of a base material layer (polyolefin base material)/a pressure-sensitive adhesive layer (pressure-sensitive acrylic adhesive) was used as the protective film. The results are indicated in Table 2.

Comparative Example 1

Operations similar to Example 1 were performed, except that a protective film (PAC-3-70 manufactured by Sun A. Kaken Co., Ltd., thickness: 70 μm) having a layer structure composed of a base material layer (LDPE base material)/a pressure-sensitive adhesive layer (pressure-sensitive EVA-based adhesive) was used as the protective film. The results are indicated in Table 2.

Comparative Example 2

Operations similar to Example 1 were performed, except that a protective film (PAC-3-50THK manufactured by Sun A. Kaken Co., Ltd., thickness: 50 μm) having a layer structure composed of a base material layer (LDPE base material)/a pressure-sensitive adhesive layer (pressure-sensitive special polyolefin adhesive) was used as the protective film. The results are indicated in Table 2.

Comparative Example 3

Operations similar to Example 1 were performed, except that a protective film (SPV-3643F manufactured by Nitto Denko Corporation, thickness: 45 μm) having a layer structure composed of a base material layer (polyethylene base material)/a pressure-sensitive adhesive layer (pressure-sensitive synthetic rubber-based adhesive) was used as the protective film. The results are indicated in Table 2.

TABLE 2

| | Protective Film | | | | | | | |
|---|---|---|---|---|---|---|---|---|
| | | | Characteristics | | | | | |
| | Base Material Layer Base Material | Pressure-sensitive Adhesive Layer Pressure-sensitive Adhesive Agent | Maximum Indentation Depth hmax [nm] | T-Peel Strength from Piezoelectric Film [N/50 mm] | MD Elastic Modulus [GPa] | Elastic Modulus Ratio | Orange Peel Skin | Planarity After Long-Term Storage |
| Example 1 | PET | Acrylic | 55.5 | 0.13 | 2.9 | 0.47 | A | A |
| Example 2 | Polyolefin | Acrylic | 58.4 | 0.25 | 0.4 | 0.06 | A | C |
| Example 3 | Polyolefin | Acrylic | 54.8 | 0.11 | 0.3 | 0.05 | A | C |
| Comparative Example 1 | LDPE | EVA-based | 49.1 | 0.03 | 0.1 | 0.02 | C | C |
| Comparative Example 2 | LDPE | Special polyolefin | 47.3 | 0.02 | 0.1 | 0.02 | C | C |
| Comparative Example 3 | Polyethylene | Synthetic rubber-based | 100< | 3.1 | 0.1 | 0.02 | Evaluation was Impossible | Evaluation was Impossible |

—Explanation for Table 2—

PET represents polyethylene terephthalate.

LDPE represents low density polyethylene.

EVA represents an ethylene/vinyl acetate copolymer.

"100<" in Table 2 indicates that it is presumed that the maximum indentation depth hmax of a protective film is more than 100 nm as described below.

As indicated in Table 2, it was found that occurrence of an orange peel texture was reduced in Examples 1 to 3, in which a protective film having a maximum indentation depth h max within a range of 53 nm to 100 nm was used.

In contrast, it was confirmed that an orange peel texture occurred in Comparative Examples 1 and 2, in which a protective film having a maximum indentation depth h max of less than 53 nm was used.

In Comparative Example 3, the protective film was difficult to peel off, and the surface of the polymeric piezoelectric film after the removal of the protective film was highly uneven. This was caused by an excessively strong peel strength between the protective film and the polymeric piezoelectric film. From this result, the maximum indentation depth h max of the protective film in Comparative Example 3 was presumably more than 100 nm.

Therefore, it was found that deterioration in appearance (orange peel texture) of the polymer film after the protective film was peeled therefrom was reduced in the layered bodies according to the Examples.

Furthermore, it was also found that the planarity of the polymer film after long-term storage is improved in Example 1, in which the elastic modulus ratio was 0.1 or more, as compared to Examples 2 and 3, in which the elastic modulus ratio was less than 0.1.

EXPLANATION OF REFERENCE CHARACTERS 10, 10A Layered body
12 Polymer film
14, 14A Protective film
16 Pressure-sensitive adhesive layer
18 Base material layer The disclosure of Japanese Patent Application No. 2016-046183, filed Mar. 9, 2016, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A layered body comprising:
a polymer film (A), the polymer film (A) including an organic piezoelectric material having a weight average molecular weight of from 50,000 to 1,000,000, having a standardized molecular orientation MORc at a reference thickness of 50 pm of from 1.0 to 15.0 as measured by a microwave transmission molecular orientation analyzer, having a degree of crystallinity of from 20% to 80% as measured by a DSC method, and having an internal haze of 50% or less with respect to visible light; and
a peelable protective film (B) that contacts one main face of the polymer film (A),
wherein a maximum indentation depth h max on a face of the protective film (B) that contacts the polymer film (A) is from 53 nm to 100 nm as measured by a nanoindentation method.

2. The layered body according to claim 1, wherein the maximum indentation depth h max is from 53 nm to 60 nm.

3. The layered body according to claim 1, wherein the protective film (B) includes a base material layer and a pressure-sensitive adhesive layer that is disposed on a main face of the base material layer which faces the polymer film (A), and the maximum indentation depth h max is a maximum indentation depth obtained by measurement on a pressure-sensitive adhesive layer side of the protective film (B).

4. The layered body according to claim 3, wherein the pressure-sensitive adhesive layer has an acid value of 10 mg KOH/g or less.

5. The layered body according to claim 3, wherein the base material layer is formed of a polyolefin-based resin or a polyethylene terephthalate-based resin, and the pressure-sensitive adhesive layer includes a pressure-sensitive acrylic adhesive.

6. The layered body according to claim 1, wherein a T-peel strength between the polymer film (A) and the protective film (B) is from 0.07 N/50 mm to 1 N/50 mm.

7. The layered body according to claim 1, wherein the polymer film (A) has an internal haze of 40% or less with respect to visible light, and a piezoelectric coefficient $d_{14}$ of 1 pC/N or more as measured by a stress-charge method at 25° C.

8. The layered body according to claim 7, wherein the internal haze is 1% or less.

9. The layered body according to claim 1, wherein the polymer film (A) has a standardized molecular orientation MORc of from 3.5 to 15.0, and a product of the standardized molecular orientation MORc of the polymer film (A) and the degree of crystallinity of the polymer film (A) is from 70 to 700.

10. The layered body according to claim 1, wherein the organic piezoelectric material is a helical chiral polymer (X) having optical activity.

11. The layered body according to claim 10, wherein the helical chiral polymer (X) is a polylactic acid-based polymer having a main chain containing a repeating unit represented by the following Formula (1):

$$\begin{array}{c}\text{(1)}\end{array}$$

12. The layered body according to claim 10, wherein the helical chiral polymer (X) has an optical purity of 95.00% e.e. or higher.

13. The layered body according to claim 10, wherein a content of the helical chiral polymer (X) in the polymer film (A) is 80% by mass or more.

14. The layered body according to claim 10, wherein the polymer film (A) includes one or more stabilizers (Y) in an amount of from 0.01 parts by mass to 10 parts by mass with respect to 100 parts by mass of the helical chiral polymer (X), the one or more stabilizers (Y) being selected from the group consisting of stabilizers (Y1) having a weight average molecular weight of from 200 to 60,000 and having one or more kinds of functional groups selected from the group consisting of a carbodiimide group, an epoxy group, and an isocyanate group, and stabilizers (Y2) having an iminoether group.

15. The layered body according to claim 1, wherein an elastic modulus of the protective film (B) and an elastic modulus of the polymer film (A) satisfy the following Relational Expression (F):

$$\text{Elastic Modulus of Protective Film }(B)/\text{Elastic Modulus of Polymer Film }(A) \geq 0.1. \quad \text{Relational Expression (F)}$$

* * * * *